(12) United States Patent
Nagai

(10) Patent No.: US 11,211,377 B2
(45) Date of Patent: Dec. 28, 2021

(54) RESISTIVE ELEMENT

(71) Applicant: FUJI ELECTRIC CO., LTD., Kawasaki (JP)

(72) Inventor: Daishi Nagai, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 16/856,723

(22) Filed: Apr. 23, 2020

(65) Prior Publication Data

US 2020/0395355 A1 Dec. 17, 2020

(30) Foreign Application Priority Data

Jun. 13, 2019 (JP) .............................. JP2019-110578

(51) Int. Cl.
*H01L 27/06* (2006.01)
*H02M 7/5387* (2007.01)
*H01L 23/00* (2006.01)

(52) U.S. Cl.
CPC .......... *H01L 27/0676* (2013.01); *H01L 24/05* (2013.01); *H01L 27/0635* (2013.01); *H01L 2224/04042* (2013.01); *H01L 2224/05553* (2013.01); *H02M 7/5387* (2013.01)

(58) Field of Classification Search
CPC . H01L 27/0676; H01L 24/05; H01L 27/0635; H01L 2224/04042; H01L 2224/05553; H01L 23/5228; H02M 7/5387
See application file for complete search history.

(56) References Cited

U.S. PATENT DOCUMENTS

| 10,727,180 B2 * | 7/2020 | Karino | .................... H01L 28/24 |
| 2019/0006460 A1 * | 1/2019 | Chiu | ................... H01L 29/1095 |
| 2019/0214382 A1 * | 7/2019 | Koya | ................... H01L 23/5223 |
| 2019/0355678 A1 * | 11/2019 | Lin | ................... H01L 21/32136 |
| 2020/0051874 A1 * | 2/2020 | Sasaki | ..................... H01L 22/32 |

FOREIGN PATENT DOCUMENTS

JP 8-306861 A 11/1996

\* cited by examiner

*Primary Examiner* — Douglas W Owens

(57) ABSTRACT

A resistive element includes: a semiconductor substrate; a lower insulating film deposited on the semiconductor substrate; a resistive layer deposited on the lower insulating film; an interlayer insulating film covering the resistive layer; a pad-forming electrode deposited on the interlayer insulating film, and including a first edge portion connected to one edge portion of the resistive layer and a second edge portion opposite to the first edge portion to be in electrical Schottky contact with the semiconductor substrate; a relay wire having one edge connected to another edge portion of the resistive layer to form an ohmic contact to the semiconductor substrate; and a counter electrode provided under the semiconductor substrate, wherein the resistive element uses a resistance value between the pad-forming electrode and the counter electrode.

7 Claims, 23 Drawing Sheets

RESISTIVE ELEMENT

CROSS-REFERENCE TO RELATED APPLICATION

This application claims benefit of priority under 35 USC 119 based on Japanese Patent Application No. 2019-110578 filed on Jun. 13, 2019, the entire contents of which are incorporated by reference herein.

BACKGROUND OF THE INVENTION

1. Field of the Invention

The present invention relates to a resistive element used as a gate resistive element connected to a gate of a switching element.

2. Description of the Related Art

JP H08-306861 A discloses a resistive element used in a semiconductor integrated circuit (IC), for example, and including a silicon substrate, an insulating layer deposited on the silicon substrate, and a resistive layer of a thin film deposited on the insulating layer. The resistive element disclosed in JP H08-306861 A further includes two electrodes at both edges on the top surface of the resistive layer, and bonding wires bonded to the respective electrodes. The resistive element with this structure inevitably increases the chip size and requires at least two bonding wires.

To deal with such circumstances, a vertical resistive element may be employed, having a structure in which one edge on the top surface of the resistive layer is connected to one electrode, and the other edge of the resistive layer is connected to form an ohmic contact to a semiconductor substrate so as to allow a current to flow in the vertical direction. The use of the vertical resistive element contributes to reducing the chip size, and also to decreasing the number of bonding wires connected to the respective electrodes, as compared with a horizontal resistive element.

A semiconductor module having a large capacity uses a switching element (a main semiconductor element) such as an insulated gate bipolar transistor (IGBT) with a greater rated current flowing through the switching element, and has a problem of oscillations during a short circuit derived from unevenness between the respective semiconductor chips in association with an increase in the number of the semiconductor chips arranged in parallel. Increasing a resistance value of a gate resistive element connected to a gate of the switching element may deal with the problem of the short-circuit oscillations. However, the increase in the resistance value of the gate resistive element has a trade-off relationship with an increase in turn-off loss.

SUMMARY OF THE INVENTION

In view of the foregoing problems, the present invention provides a resistive element capable of avoiding a reduction in loss of a switching element while preventing oscillations upon a short circuit in the switching element.

An aspect of the present invention inheres in a resistive element including: a semiconductor substrate; a lower insulating film deposited on the semiconductor substrate; a resistive layer deposited on the lower insulating film; an interlayer insulating film covering the resistive layer; a pad-forming electrode deposited on the interlayer insulating film, and including a first edge portion connected to one edge portion of the resistive layer and a second edge portion opposite to the first edge portion to be in electrical Schottky contact with the semiconductor substrate; a relay wire having one edge connected to another edge portion of the resistive layer to form an ohmic contact to the semiconductor substrate; and a counter electrode provided under the semiconductor substrate, wherein the resistive element uses a resistance value between the pad-forming electrode and the counter electrode.

DETAILED DESCRIPTION

Figure 1:
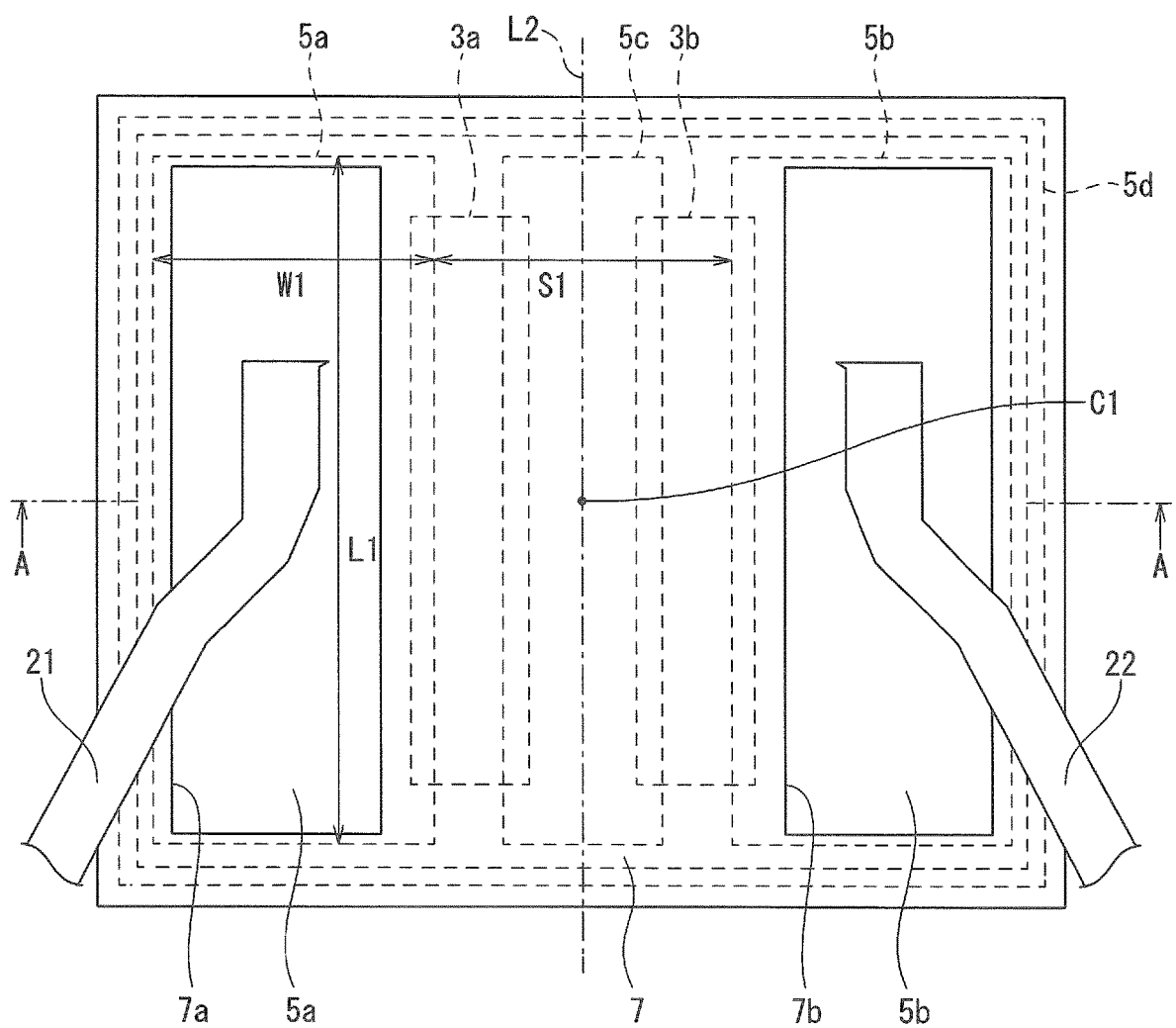
FIG. 1 is a plan view illustrating a resistive element according to a first embodiment of the present invention.

With reference to the Drawings, first and second embodiments of the present invention will be described below. In the Drawings, the same or similar elements are indicated by the same or similar reference numerals. The Drawings are schematic, and it should be noted that the relationship between thickness and planer dimensions, the thickness proportion of each layer, and the like are different from real ones. Accordingly, specific thicknesses or dimensions should be determined with reference to the following description. Moreover, in some drawings, portions are illustrated with different dimensional relationships and proportions. The embodiments described below merely illustrate schematically devices and methods for specifying and giving shapes to the technical idea of the present invention, and the span of the technical idea is not limited to materials, shapes, structures, and relative positions of elements described herein.

Further, definitions of directions such as an up-and-down direction in the following description are merely definitions for convenience of understanding, and are not intended to limit the technical ideas of the present invention. For example, as a matter of course, when the subject is observed while being rotated by 90°, the subject is understood by converting the up-and-down direction into the right-and-left direction. When the subject is observed while being rotated by 180°, the subject is understood by inverting the up-and-down direction. When the subject is observed while being rotated by 180°, the definitions of "front" and "back" are reversed.

First Embodiment

<Resistive Element>

A resistive element according to a first embodiment of the present invention is used as a gate resistive element connected to a gate of a switching element (a main semiconductor element) such as an insulated-gate bipolar transistor (IGBT).

The resistive element according to the first embodiment has a rectangular planar pattern, as illustrated in FIG. 1, which is a typical structure. The resistive element according to the first embodiment has a chip size of about 2.8×2.5 millimeters, for example.

Figure 2:
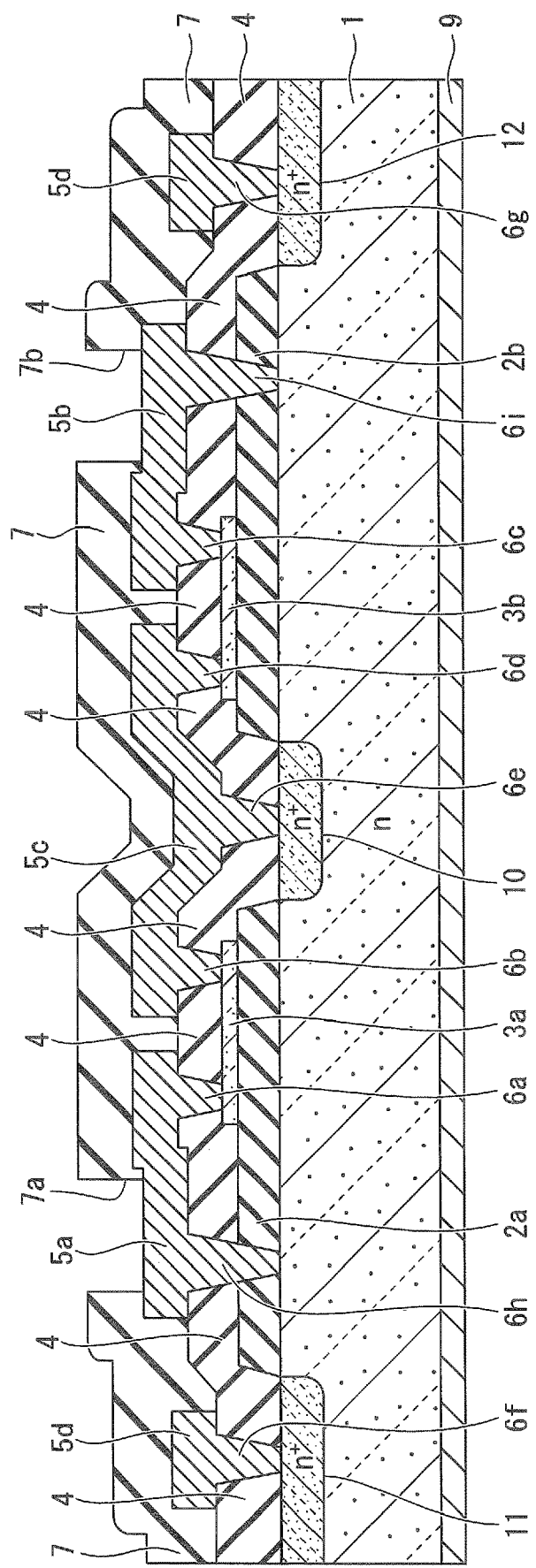
FIG. 2 is a cross-sectional view as viewed from direction A-A in FIG. 1.

As illustrated in FIG. 2, the resistive element according to the first embodiment includes a semiconductor substrate 1 of a first conductivity-type (n-type), a first lower insulating film 2a and a second lower insulating film 2b deposited on the semiconductor substrate 1, and a resistive layer (a first resistive layer) 3a and another resistive layer (a second resistive layer) 3b of thin films respectively deposited on the first lower insulating film 2a and the second lower insulating film 2b. While the cross-sectional view of FIG. 2 visually indicates the first lower insulating film 2a and the second lower insulating film 2b independently of each other denoted by the different reference numerals, the first lower insulating film 2a and the second lower insulating film 2b may be a single member integrated on the back side of the sheet of FIG. 2. The first lower insulating film 2a and the second lower insulating film 2b thus can be herein collectively referred to as a "lower insulating film".

A thickness of the semiconductor substrate 1 is in a range of about 250 to 450 micrometers, for example. The content of a resistive component of the semiconductor substrate 1 is preferably decreased to a level which can be ignored with respect to a resistive component of the first resistive layer 3a and the second resistive layer 3b. In particular, the content of the resistive component of the semiconductor substrate 1 is preferably about one hundredth or less of that of the first resistive layer 3a and the second resistive layer 3b. A specific resistivity of the semiconductor substrate 1 can be set in a range of about 2 to 60 mΩ·cm. The semiconductor substrate 1 may be a silicon (Si) substrate, for example. A middle contact region 10, a first peripheral contact region 11, and a second peripheral contact region 12, each being the first conductivity type ($n^+$-type) and having a higher impurity concentration (lower specific resistivity) than the semiconductor substrate 1, are deposited in the upper portion of the semiconductor substrate 1.

The first lower insulating film 2a and the second lower insulating film 2b are each a field insulating film having a thickness set in a range of about 600 to 1,000 nanometers, for example. The first lower insulating film 2a and the second lower insulating film 2b may be a silicon oxide film (a $SiO_2$ film), a silicon nitride film (a $Si_3N_4$ film), or a composite film of these films. The first lower insulating film 2a and the second lower insulating film 2b may be deposited by a chemical vapor deposition (CVD) method using gas containing an organic silicon compound such as tetraethoxysilane (TEOS), for example. Increasing the thickness of the first lower insulating film 2a and the second lower insulating film 2b can reduce a parasitic capacitance.

A thickness of the first resistive layer 3a and the second resistive layer 3b is in a range of about 400 to 600 nanometers, and a sheet resistance of the first resistive layer 3a and the second resistive layer 3b is in a range of about 100 to 200 Ω/sq, for example. The resistance value of the first resistive layer 3a and the second resistive layer 3b can be regulated such that the thickness, the width (in the depth direction in FIG. 2), and the length (in the right-left direction in FIG. 2) of the first resistive layer 3a and the second resistive layer 3b are adjusted, and such that the material included in the first resistive layer 3a and the second resistive layer 3b is selected as appropriate.

The first resistive layer 3a and the second resistive layer 3b may each be a doped polysilicon (DOPOS) layer of n-type. The n-type DOPOS layer can be obtained such that impurity ions such as phosphorus (P) or boron (B) are implanted in polycrystalline silicon (polysilicon), or such that polycrystalline silicon to which impurity ions are added from a gas phase using doping gas is deposited by a CVD method. The resistance value of the first resistive layer 3a and the second resistive layer 3b can also be regulated, when using the DOPOS layer, such that the amount of impurity ions added to the polysilicon is adjusted.

The first resistive layer 3a and the second resistive layer 3b preferably have a temperature coefficient of zero or a negative number. Such a temperature coefficient can avoid an increase in the resistance value during operation at a high temperature. The temperature coefficient of the DOPOS layer can be regulated such that a dose of impurity ions implanted in the polysilicon is adjusted. For example, when the dose is set to about $7.0 \times 10^{15}$ $cm^{-2}$ or less, the temperature coefficient of the DOPOS layer can be set to zero ppm/° C. or lower. The temperature coefficient of the first resistive layer 3a and the second resistive layer 3b is not intended to be limited to zero ppm/° C. or lower. The first resistive layer 3a and the second resistive layer 3b may have a temperature coefficient of a positive number.

The first resistive layer 3a and the second resistive layer 3b are not limited to the DOPOS layer, and may be a nitride film of transition metal such as tantalum nitride (TaN$_x$), or a stacked metallic film including a chromium (Cr) film, a nickel (Ni) film, and a manganese (Mn) film stacked in this order and having a high melting point. Alternatively, the first resistive layer 3a and the second resistive layer 3b may each be a thin film of silver-palladium (AgPd) or ruthenium oxide (RuO$_2$). Alternatively, the first resistive layer 3a and the second resistive layer 3b may be implemented by p-type diffusion layers or n-type diffusion layers deposited on the semiconductor surface, which differ from the structure illustrated in FIG. 2.

An interlayer insulating film 4 is deposited to cover the first lower insulating film 2a, the second lower insulating film 2b, the first resistive layer 3a, and the second resistive layer 3b. A thickness of the interlayer insulating film 4 is in a range of about 1,000 to 2,000 nanometers, for example. The interlayer insulating film 4 may be a silicon oxide film (a SiO$_2$ film) without containing impurity ions which is typically referred to as a non-doped silicate glass (NSG) film, a phosphosilicate glass film (a PSG film), or a borosilicate glass film (a BSG film). Alternatively, the interlayer insulating film 4 may be either a single-layer film of a borophosphosilicate glass film (a BPSG film) or a silicon nitride film (a Si$_3$N$_4$ film), or a composite film of any of the above films combined together. For example, the interlayer insulating film 4 may be a composite film including a NSG film with a thickness of about 500 to 800 nanometers and a PSG film with a thickness of about 400 to 800 nanometers stacked together. The NSG film is presumed to decrease a variation in resistance. The PSG film is presumed to ensure the strength of the wire bonding.

A pair of a pad-forming electrode (referred to also as a first pad-forming electrode or a first front surface electrode) 5a and a pad-forming electrode (referred to also as a second pad-forming electrode or a second front surface electrode) 5b are deposited on the interlayer insulating film 4. The first pad-forming electrode 5a is allocated above the first lower insulating film 2a, and one edge of the first pad-forming electrode 5a horizontally overlaps with one edge of the first resistive layer 3a in the depth direction. The second pad-forming electrode 5b is allocated above the second lower insulating film 2b, and one edge of the second pad-forming electrode 5b horizontally overlaps with one edge of the second resistive layer 3b in the depth direction.

A relay wire 5c interposed between the pair of the first pad-forming electrode 5a and the second pad-forming electrode 5b is also deposited on the interlayer insulating film 4. The relay wire 5c has a wing-like shape horizontally extending across and spanning above the first lower insulating film 2a and the second lower insulating film 2b, and also extends downward in the middle so as to have a substantially T-shaped structure in cross section.

The first pad-forming electrode 5a has one edge portion (a first edge portion) and the other edge portion (a second edge portion) opposite to the first edge portion. The first edge portion of the first pad-forming electrode 5a is connected to one edge portion of the first resistive layer 3a via a first pad contact region 6a. The other edge portion of the first resistive layer 3a is connected to one edge (a first resistive layer connection edge) of the relay wire 5c via a first relay contact region 6b.

The second pad-forming electrode 5b has one edge portion (a third edge portion) and the other edge portion (a fourth edge portion) opposite to the third edge portion. The third edge portion of the second pad-forming electrode 5b is connected to one edge portion of the second resistive layer 3b via a second pad contact region 6c. The other edge of the second resistive layer 3b is connected to the other edge (a second resistive layer connection edge) of the relay wire 5c via a second relay contact region 6d.

A substrate connection terminal at the middle edge of the T-shaped relay wire 5c is connected to form an ohmic contact to the middle contact region 10 buried in the upper portion of the semiconductor substrate 1 at a low contact resistance via a substrate contact region 6e. A counter electrode (a rear surface electrode) 9 is provided on the rear surface of the semiconductor substrate 1. The first resistive layer 3a and the second resistive layer 3b are thus connected to the semiconductor substrate 1 in series via the relay wire 5c, so as to implement a vertical resistive element including a resistor between the first pad-forming electrode 5a and the counter electrode 9 opposed to each other, and a resistor between the second pad-forming electrode 5b and the counter electrode 9 opposed each other.

A thickness of the pair of the first pad-forming electrode 5a and the second pad-forming electrode 5b, and a thickness of the relay wire 5c are each about three micrometers, for example. The pair of the first pad-forming electrode 5a and the second pad-forming electrode 5b, and the relay wire 5c may be a stacked film including a titanium/titanium nitride (Ti/TiN) film with a thickness of about 100 to 130 nanometers serving as barrier metal, an aluminum-silicon (Al—Si) film with a thickness of about three micrometers, and a TiN/Ti film with a thickness of about 35 to 55 nanometers serving as a reflection preventing film. Instead of Al—Si, Al or an Al alloy such as Al—Cu—Si or Al—Cu may be used. The pair of the first pad-forming electrode 5a and the second pad-forming electrode 5b each serve as an electrode pad for outputting (for mounting). A first bonding wire 21 and a second bonding wire 22 (refer to FIG. 1) having a diameter of about 200 to 400 micrometers made of metal such as aluminum (Al) are connected to the pair of the first pad-forming electrode 5a and the second pad-forming electrode 5b.

A guard ring layer 5d may be deposited on the interlayer insulating film 4. The guard ring layer 5d includes the same material as the pair of the first pad-forming electrode 5a and the second pad-forming electrode 5b and the relay wire 5c. The guard ring layer 5d is delineated into a ring shape along the outer periphery of the chip of the resistive element according to the first embodiment, for example. The guard ring layer 5d is connected to form an ohmic contact to the first peripheral contact region 11 and the second peripheral contact region 12 provided in the upper portion of the semiconductor substrate 1 via a first edge contact region 6f and a second edge contact region 6g.

Although not illustrated, an active region, such as a semiconductor region of n-type or p-type implementing an IGBT as a main semiconductor element, may be present in a region inside the guard ring layer 5d to be surrounded by the first peripheral contact region 11 and the second peripheral contact region 12. Such a semiconductor region of n-type or p-type implementing the main semiconductor element is not necessarily present in the region inside the guard ring layer 5d, which depends on the design specifications of the chip. For example, the main semiconductor element may be implemented in a different chip. When the main semiconductor element is present in the same chip, the guard ring layer 5d is provided so as to improve the breakdown voltage of the main semiconductor element.

While the cross-sectional view of FIG. 2 indicates the "first peripheral contact region 11" and the "second peripheral contact region 12" by the different reference numerals, these regions are not necessarily independent of each other, and may be a ring-like diffusion region integrated on the back side of the sheet of FIG. 2, for example.

A passivation film 7 is laminated on the pair of the first pad-forming electrode 5a and the second pad-forming electrode 5b, the relay wire 5c, and the guard ring layer 5d. The passivation film 7 prevents moisture from entering from the side surface of the chip. The passivation film 7 may be a composite film including a tetraethoxysilane (TEOS) film containing TEOS deposited as raw material gas, a $Si_3N_4$ film, and a polyimide film, which are sequentially stacked. The passivation film 7 is provided with a first window 7a and a second window 7b. The first pad-forming electrode 5a and the second pad-forming electrode 5b are partly exposed to the first window 7a and the second window 7b to define the pad regions for mounting to which the first bonding wire 21 and the second bonding wire 22 (refer to FIG. 1) can be bonded.

As illustrated in FIG. 1, the resistive element according to the first embodiment has a rectangular planar pattern, defining a direction in which the pair of the first pad-forming electrode 5a and the second pad-forming electrode 5b and the relay wire 5c are arranged as a longitudinal direction. The first pad-forming electrode 5a allocated on the left side illustrated in FIG. 1 has a rectangular planar pattern having a length L1 and a width W1, and the second pad-forming electrode 5b allocated on the right side illustrated in FIG. 1 has a similar shape (common shape) having a length L1 and a width W1 which are substantially the same dimensions as the first pad-forming electrode 5a. The first pad-forming electrode 5a and the second pad-forming electrode 5b are arranged in parallel and separated with a space S1. The length L1 of each of the first pad-forming electrode 5a and the second pad-forming electrode 5b is about 2.0 millimeters, the width W1 is about 0.9 millimeters, and the space S1 is about 0.5 millimeters or greater, for example. As illustrated in FIG. 1, the first resistive layer 3a, the second resistive layer 3b, and the relay wire 5c each also have a rectangular planar pattern in which the vertical direction in FIG. 1 is the longitudinal direction, for example. One of the resistive layers, which is the first resistive layer 3a, has a similar shape having substantially the same dimensions as the other resistive layer (the second resistive layer) 3b.

The relay wire 5c having a rectangular planar pattern is allocated along the straight line L2 passing through the center C1 of the chip in the planar pattern. The first resistive layer 3a, the second resistive layer 3b, the first pad-forming electrode 5a, the second pad-forming electrode 5b, and the relay wire 5c are arranged with line symmetry about the straight line L2 passing through the center C1 of the chip in the planar pattern. Namely, the entire planar pattern including the first resistive layer 3a, the second resistive layer 3b, the first pad-forming electrode 5a, the second pad-forming electrode 5b, and the relay wire 5c has two-fold rotational symmetry about the center C1 of the chip. This arrangement allows the resistive element according to the first embodiment to be turned by 180 degrees upon packaging, so as to facilitate the process of assembly.

FIG. 1 illustrates the first bonding wire 21 and the second bonding wire 22 bonded to the pad regions for mounting at which the first pad-forming electrode 5a and the second pad-forming electrode 5b are exposed to the first window 7a and the second window 7b.

As illustrated in FIG. 2, the counter electrode 9 is arranged on the bottom surface of the semiconductor substrate 1. The counter electrode 9 may be a single film made of gold (Au), or a metallic film including a titanium (Ti) film, a nickel (Ni) film, and a gold (Au) film stacked in this order. The outermost layer of the counter electrode 9 may be made of material which can be soldered. The counter electrode 9 is fixed to a metal plate (not illustrated) by soldering, for example.

The resistive element according to the first embodiment, as illustrated in FIG. 2, has a fundamental structure in which the resistive layer connection terminals at the two opposite edges of the T-shaped relay wire 5c are connected to the first resistive layer 3a and the second resistive layer 3b. The substrate connection terminal at the middle edge of the T-shaped relay wire 5c is connected to form an ohmic contact to the middle contact region 10 buried in the semiconductor substrate 1 at a low contact resistance so as to implement the vertical resistive element. A single pad region for mounting, which is a part of the first pad-forming electrode 5a connected to the first resistive layer 3a, is thus allotted to the first resistive layer 3a, and a single pad region for mounting, which is a part of the second pad-forming electrode 5b connected to the second resistive layer 3b, is allotted to the second resistive layer 3b.

The resistive element according to the first embodiment thus only requires a single bonding wire for each of the first resistive layer 3a and the second resistive layer 3b, so as to decrease the total number of the bonding wires, as compared with a lateral resistive element. Further, the areas of the pad regions for mounting on the top surface can be decreased as compared with a lateral resistive element, decreasing the size of the chip accordingly.

In the resistive element according to the first embodiment, the first pad-forming electrode 5a is in nonlinear contact (Schottky contact) with the semiconductor substrate 1 via a contact region (a first parallel contact region) 6h penetrating the first lower insulating film 2a and the interlayer insulating film 4 located immediately under the first pad-forming electrode 5a. Namely, the resistive element according to the first embodiment internally includes a Schottky barrier diode having nonlinear current-voltage characteristics (I-V characteristics) implemented by the first parallel contact region 6h and the semiconductor substrate 1. The adjustment of the size or the number of the first parallel contact region 6h can regulate the Schottky contact area as appropriate.

The second pad-forming electrode 5b is in nonlinear contact (Schottky contact) with the semiconductor substrate 1 via another contact region (a second parallel contact region) 6i penetrating the second lower insulating film 2b and the interlayer insulating film 4 located immediately under the second pad-forming electrode 5b. Namely, the resistive element according to the first embodiment internally includes a Schottky barrier diode implemented by the second parallel contact region 6i and the semiconductor substrate 1. The adjustment of the size or the number of the second parallel contact region 6i can regulate the Schottky contact area as appropriate.

Figure 3:
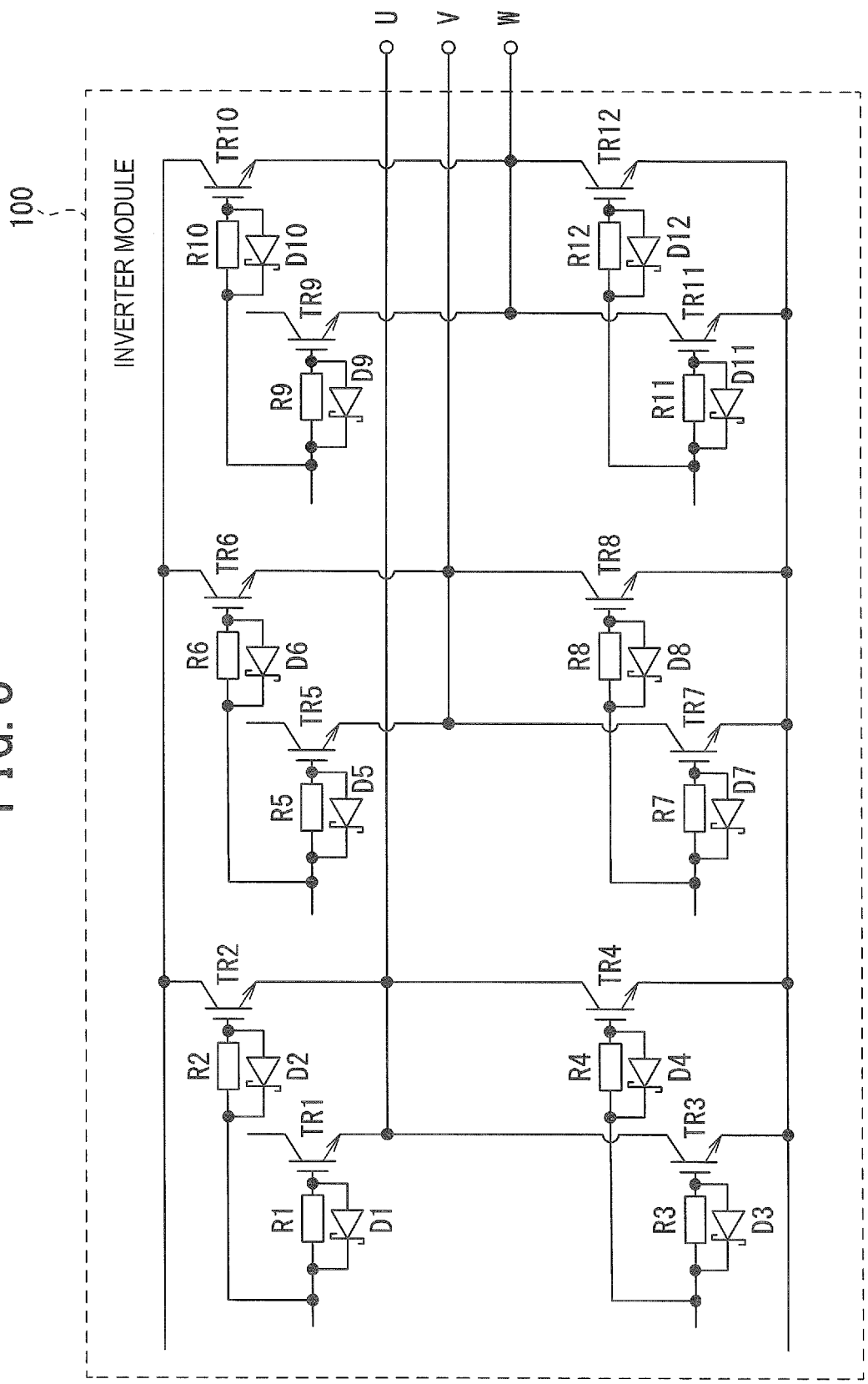
FIG. 3 is a circuit diagram of an inverter using the resistive element according to the first embodiment.

When the resistive element according to the first embodiment is used as a gate resistive element for an IGBT serving as a main semiconductor element, for example, an oscillation phenomenon upon the switching operation of the IGBT can be avoided. The resistive element according to the first embodiment can be used as a gate resistive element of a semiconductor element in an inverter module (a semiconductor device) 100 for driving a three-phase motor having a u-phase, a v-phase, and a w-phase, for example, as illustrated in FIG. 3.

The inverter module 100 includes power main semiconductor elements TR1, TR2, TR3, and TR4 for driving the u-phase, power main semiconductor elements TR5, TR6, TR7, and TR8 for driving the v-phase, and power main semiconductor elements TR9, TR10, TR11, and TR12 for driving the w-phase. The main semiconductor elements TR1 to TR12 are each connected to a freewheeling diode (not illustrated). The main semiconductor elements TR1 to TR12 may each be an IGBT. The gate electrodes of the main semiconductor elements TR1 to TR12 are connected to gate resistive elements R1 to R12. Further, Schottky barrier diodes D1 to D12 are connected in parallel to the gate resistive elements R1 to R12.

The resistive element according to the first embodiment can be used as the pair of the gate resistive elements R1 and R2 and the pair of the Schottky barrier diodes D1 and D2, as the pair of the gate resistive elements R3 and R4 and the pair of the Schottky barrier diodes D3 and D4, as the pair of the gate resistive elements R5 and R6 and the pair of the Schottky barrier diodes D5 and D6, as the pair of the gate resistive elements R7 and R8 and the pair of the Schottky barrier diodes D7 and D8, as the pair of the gate resistive elements R9 and R10 and the pair of the Schottky barrier diodes D9 and D10, and as the pair of the gate resistive elements R11 and R12 and the pair of the Schottky barrier diodes D11 and D12.

For example, the first resistive layer 3a and the second resistive layer 3b illustrated in FIG. 1 and FIG. 2 correspond to the gate resistive elements R1 and R2. The terminals on the side on which the gate resistive elements R1 and R2 are connected to the gate electrodes of the power main semiconductor elements TR1 and TR2 correspond to the terminals toward the pair of the first pad-forming electrode 5a and the second pad-forming electrode 5b illustrated in FIG. 1 and FIG. 2. The other terminals on the side opposite to the side on which the gate resistive elements R1 and R2 connected to the gate electrodes of the power main semiconductor elements TR1 and TR2 correspond to the terminals toward the counter electrode 9 illustrated in FIG. 2. The Schottky barrier diodes D1 and D2 connected in parallel to the gate resistive elements R1 and R2 correspond to the Schottky barrier diode implemented by the first parallel contact region 6h and the semiconductor substrate 1 and the Schottky barrier diode implemented by the second parallel contact region 6i and the semiconductor substrate 1, as illustrated in FIG. 2.

For the group of the pair of the gate resistive elements R1 and R2, the pair of the Schottky barrier diodes D1 and D2, and the main semiconductor elements TR1 and TR2, for example, when the pair of the gate resistive elements R1 and R2 and the pair of the Schottky barrier diodes D1 and D2 are integrated into a single resistor chip (R1, R2, D1, D2), and the main semiconductor elements TR1 and TR2 are integrated into a single IGBT chip (TR1, TR2), the resistor chip (R1, R2, D1, D2) and the IGBT chip (TR1, TR2) are mounted on the substrate.

Comparative Example

Figure 4:
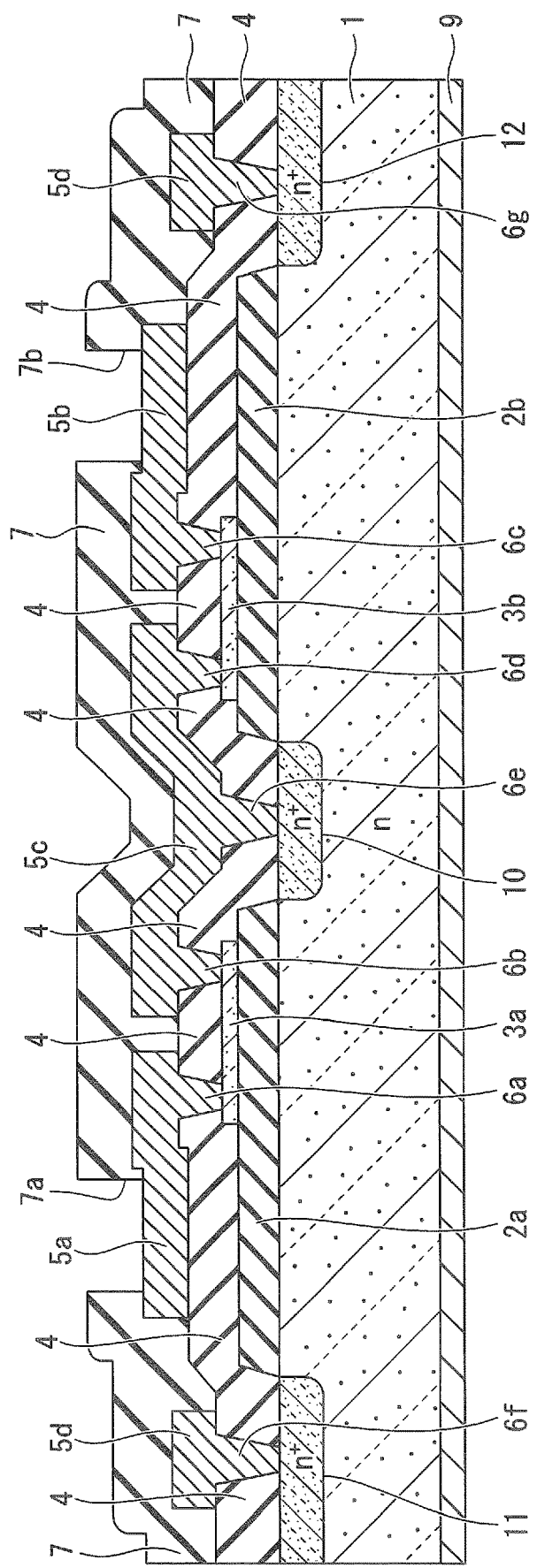
FIG. 4 is a cross-sectional view of a resistive element of a comparative example.

A resistive element of a comparative example is described below. As illustrated in FIG. 4, the resistive element of the comparative example differs from the resistive element according to the first embodiment illustrated in FIG. 2 in that neither the first parallel contact region 6h nor the second parallel contact region 6i implementing the Schottky barrier diode together with the semiconductor substrate 1 is provided immediately under the first pad-forming electrode 5a or the second pad-forming electrode 5b. When the resistive element of the comparative example is used as a gate resistive element of a main semiconductor element, the gate resistance value when the main semiconductor element is turned on is equal to the gate resistance value when the main semiconductor element is turned off. Increasing the resistance value of the gate resistive element for avoiding oscillations upon a short circuit has a trade-off relationship with an increase in constant switching loss when turned off.

In contrast, as illustrated in FIG. 1 and FIG. 2, the resistive element according to the first embodiment includes the Schottky barrier diodes provided in parallel having the nonlinear I-V characteristics in the first resistive layer 3a and the second resistive layer 3b, so that the resistance value of the resistive element according to the first embodiment varies depending on the direction of a current flowing through the resistive element according to the first embodiment.

Figure 5A:
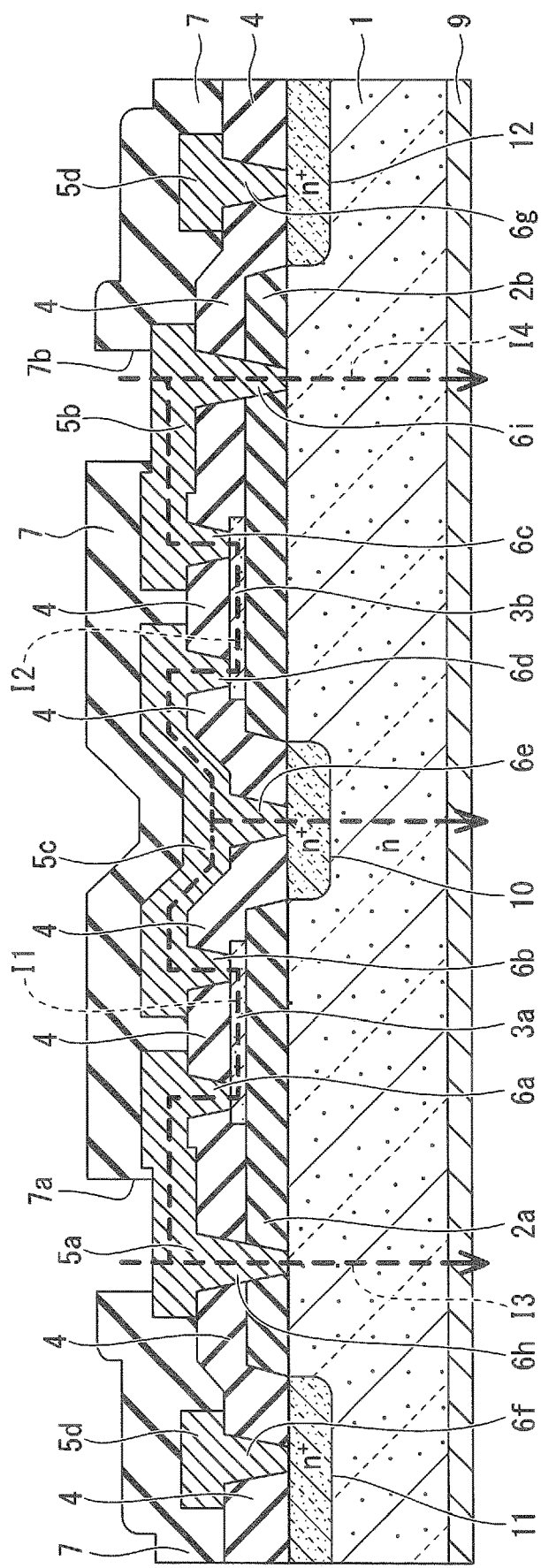
FIG. 5A is a cross-sectional view additionally indicating current channels when a current flows in the resistive element according to the first embodiment.
Figure 5B:
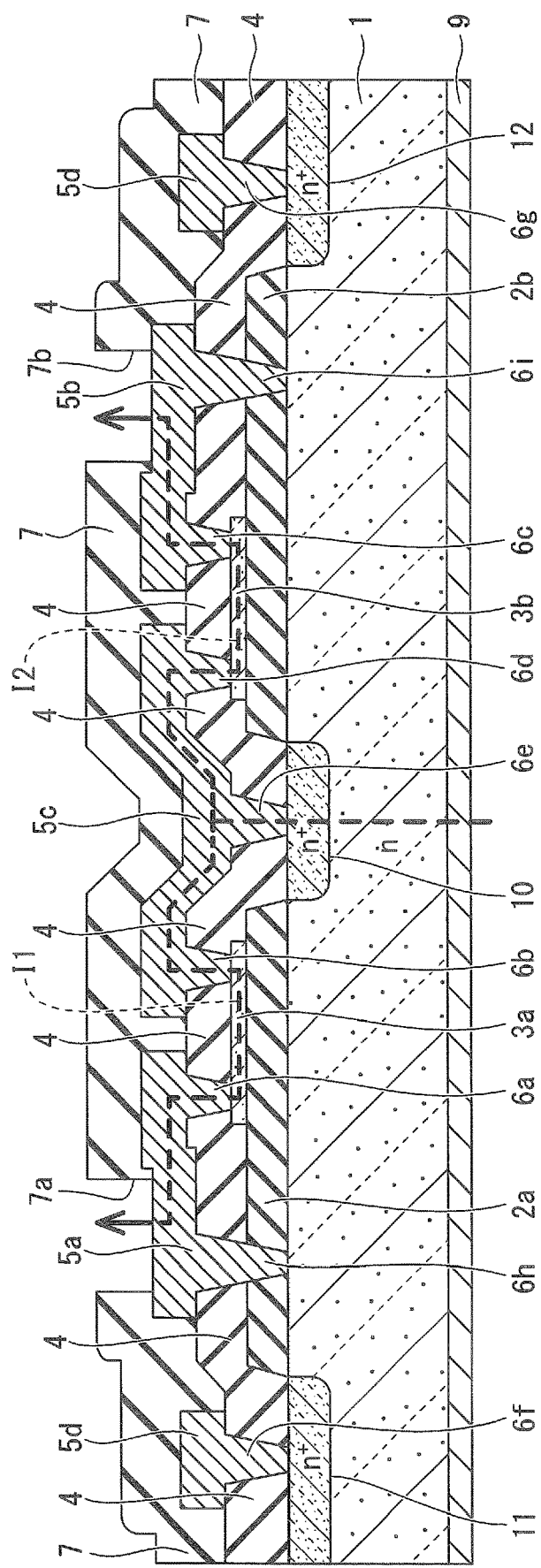
FIG. 5B is a cross-sectional view additionally indicating current channels when a current flows in the opposite direction of the current illustrated in FIG. 5A in the resistive element according to the first embodiment.

In particular, in a case of a polarity in which the Schottky barrier diodes conduct the current at a low resistance, current channels I1 and I2 in which the current flows from the first pad-forming electrode 5a and the second pad-forming electrode 5b to the counter electrode 9 through the first resistive layer 3a and the second resistive layer 3b, and current channels 13 and 14 in which the current flows from the first pad-forming electrode 5a and the second pad-forming electrode 5b to the counter electrode 9 through the respective Schottky barrier diodes implemented by each of the first parallel contact region 6h and the second parallel contact region 6i and the semiconductor substrate 1, are formed in parallel, as schematically indicated by the arrows of the broken lines in FIG. 5A. In a case of a polarity in which the Schottky barrier diodes cannot conduct the current at a low resistance, only the current channels I1 and I2 are formed in which the current flows from the counter electrode 9 to the first pad-forming electrode 5a and the second pad-forming electrode 5b through the first resistive layer 3a and the second resistive layer 3b, as schematically indicated by the arrows of the broken lines in FIG. 5B, while the current channels via the Schottky barrier diodes are not provided. When the current channels I1 and I2 via the first resistive layer 3a and the second resistive layer 3b and the current channels 13 and 14 via the Schottky barrier diodes as illustrated in FIG. 5A are formed in parallel, the resistance value is decreased as compared with the case in which only the current channels I1 and I2 via the first resistive layer 3a and the second resistive layer 3b are formed as illustrated in FIG. 5B.

For example, when the resistive element according to the first embodiment is connected to the gate of the main semiconductor element of the IGBT, the gate resistance value can be changed between the turned-on state and the turned-off state of the main semiconductor element. In particular, when a voltage of about 15 volts, for example, is applied to the gate of the main semiconductor element when turned on, only the current channels I1 and I2 via the first resistive layer 3a and the second resistive layer 3b are formed as illustrated in FIG. 5B, and the gate resistance value relatively increases. When a voltage of about −5 to −15 volts is applied to the gate of the main semiconductor element when turned off, the current channels I1 and I2 via the first resistive layer 3a and the second resistive layer 3b and the current channels 13 and 14 via the Schottky barrier diodes as illustrated in FIG. 5A are formed in parallel, and the gate resistance value relatively decreases. This configuration can decrease the gate resistance value when turned off, while keeping the gate resistance value when turned on contributing to the oscillations, so as to reduce a turn-off loss.

Example

Figure 5C:
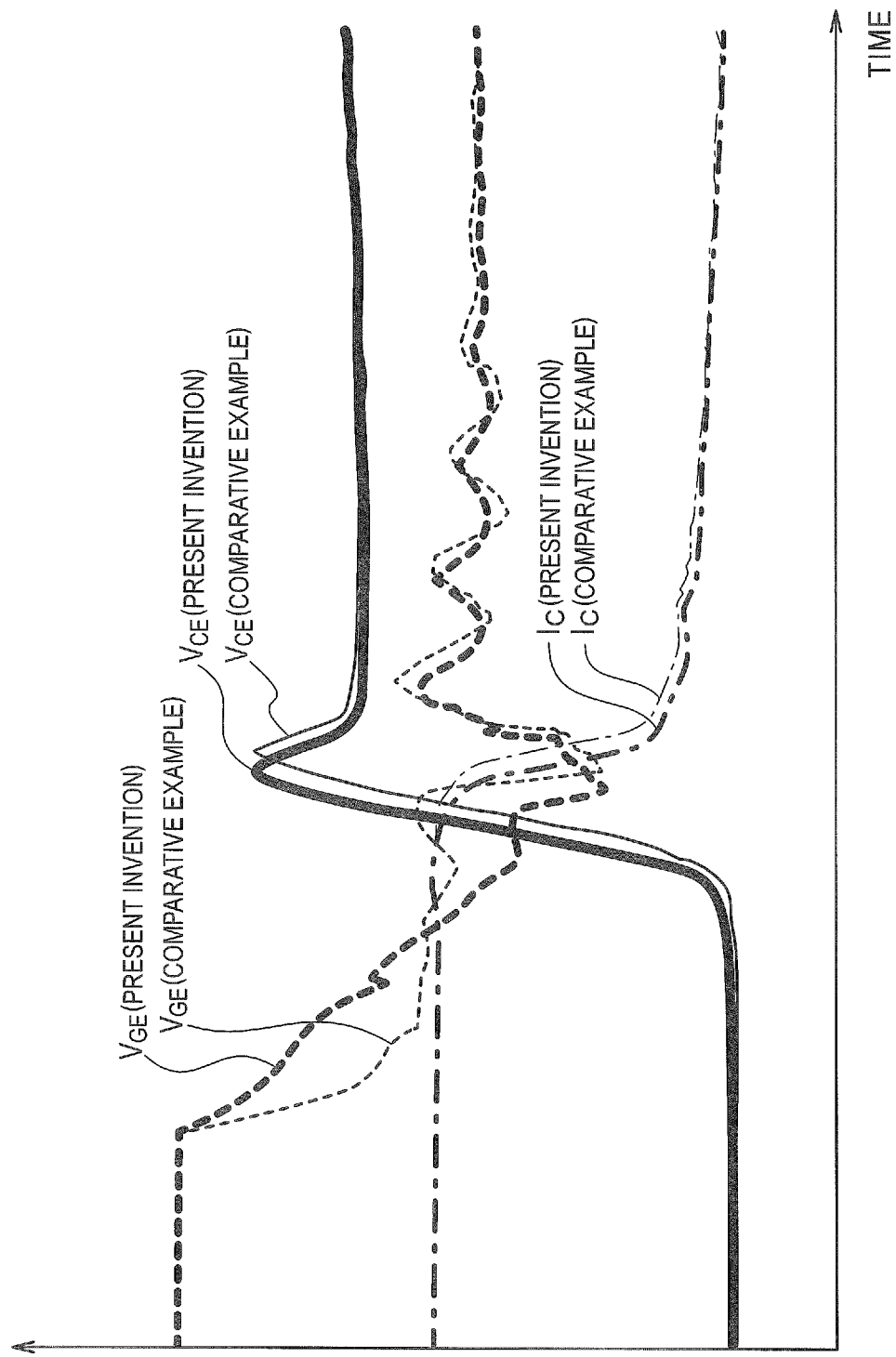
FIG. 5C is a graph showing switching waveforms of the resistive element according to the first embodiment.

FIG. 5C is a graph showing a time-course change of each of a voltage $V_{GE}$ between the gate and the emitter, a voltage $V_{CE}$ between the collector and the emitter, and a collector current $I_C$ in the resistive element according to the first embodiment when including the first parallel contact region 6h immediately under the first pad-forming electrode 5a on the left side to implement the Schottky barrier diode as illustrated in FIG. 2 but not including the second parallel contact region 6i immediately under the second pad-forming electrode 5b on the right side, and when using the first resistive layer 3a on the left side and the second resistive layer 3b on the right side each as the gate resistive element.

As illustrated in FIG. 5C, in the case in which the first resistive layer 3a provided with the Schottky barrier diode is used as the gate resistive element (indicated by "present invention" in FIG. 5C), the switching time is decreased, as compared with the case in which the second resistive layer 3b not provided with the Schottky barrier diode is used as the gate resistive element (indicated by "comparative example" in FIG. 5C). The use of the first resistive layer 3a provided with the Schottky barrier diode as the gate resistive element can decrease the gate resistance value increased for dealing with the oscillations when turned off, so as to reduce a turn-off loss.

<Method of Manufacturing Resistive Element>

An example of a method of manufacturing the resistive element according to the first embodiment is described below with reference to FIG. 6 to FIG. 16. It should be understood that the method of manufacturing the resistive element and the exemplified values and materials described below are examples, and the first embodiment can be implemented by various methods other than the following method including modified examples within the scope of the invention as defined by the appended claims.

Figure 6:
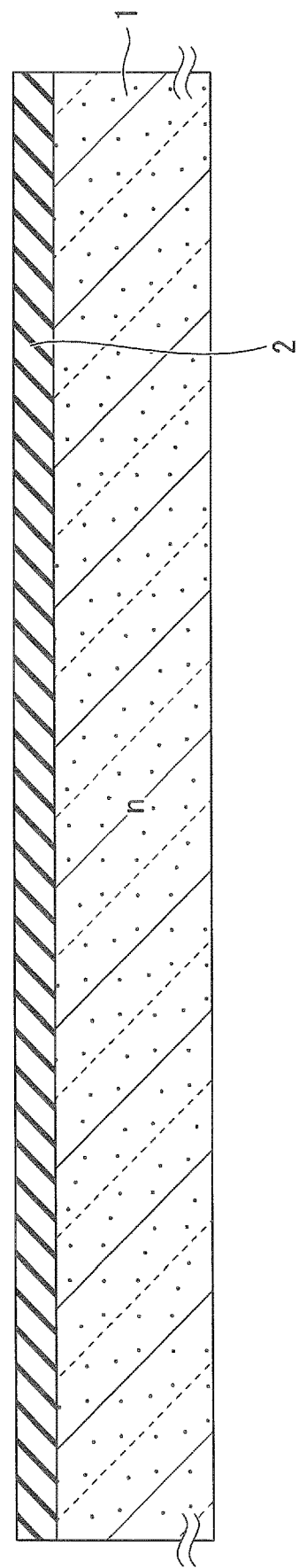
FIG. 6 is a cross-sectional view illustrating a process of manufacturing the resistive element according to the first embodiment.

First, the semiconductor substrate 1 such as a silicon substrate of n-type is prepared. As illustrated in FIG. 6, the lower insulating film 2 such as a TEOS film is deposited on the semiconductor substrate 1 by a low-pressure chemical vapor deposition (LPCVD) method, for example. The lower insulating film 2 may be a composite film including a thermal oxide film formed by a thermal oxidation method and an insulating film further deposited on the thermal oxide film by a CVD method so as to be stacked together.

Figure 7:
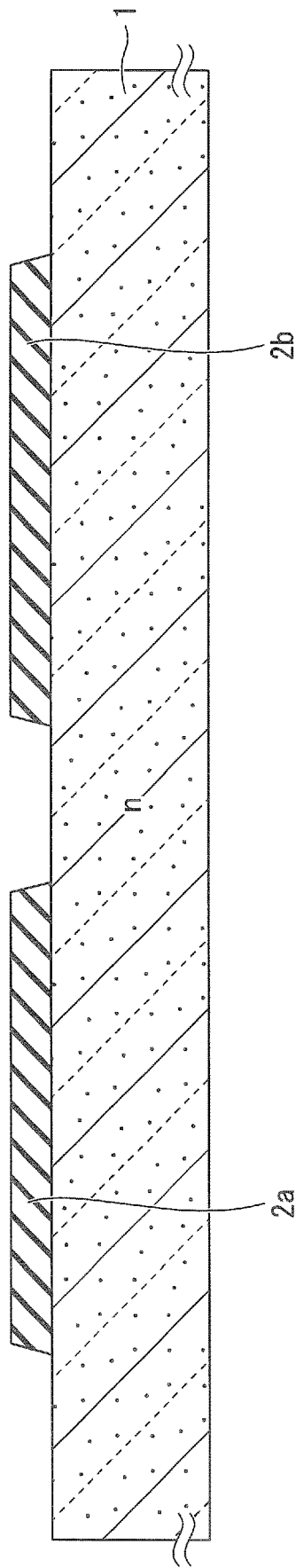
FIG. 7 is a cross-sectional view, continued from FIG. 6, illustrating the process of manufacturing the resistive element according to the first embodiment.

A photoresist film is then coated on the top surface of the lower insulating film 2, and is delineated by photolithography. Using the delineated photoresist film as an etching mask, a part of the lower insulating film 2 is selectively removed by dry etching such as reactive ion etching (RIE). The photoresist film is then removed, so as to partly provide the patterns of the first lower insulating film 2a and the second lower insulating film 2b on the top surface of the semiconductor substrate 1, as illustrated in FIG. 7. The first lower insulating film 2a and the second lower insulating film 2b may be integrated on the back side of the sheet of FIG. 7. FIG. 7 illustrates the opening portion provided in the middle of the continuous lower insulating film in cross section.

Figure 8:
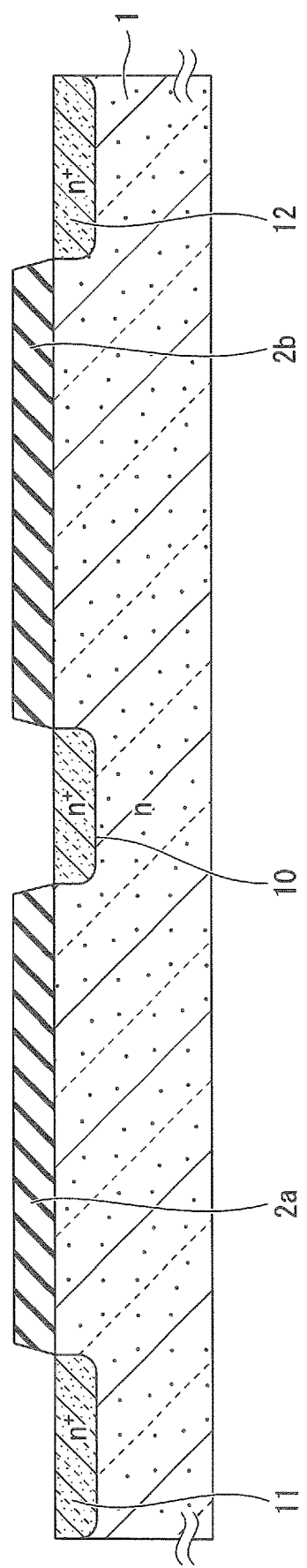
FIG. 8 is a cross-sectional view, continued from FIG. 7, illustrating the process of manufacturing the resistive element according to the first embodiment.

Next, a photoresist film is coated on the first lower insulating film 2a and the second lower insulating film 2b and part of the semiconductor substrate 1 exposed on the pattern of the first lower insulating film 2a and the second lower insulating film 2b, and is delineated by photolithography. Using the delineated photoresist film as a mask for ion implantation, n-type impurity ions such as phosphorus (P) are selectively implanted in the semiconductor substrate 1. After the photoresist film used as the mask for ion implantation is removed, the impurity ions are activated by annealing, so as to provide the n$^+$-type middle contact region 10, the n$^+$-type first peripheral contact region 11, and the n$^+$-type second peripheral contact region 12 at the upper portion of the semiconductor substrate 1, as illustrated in FIG. 8.

Figure 9:
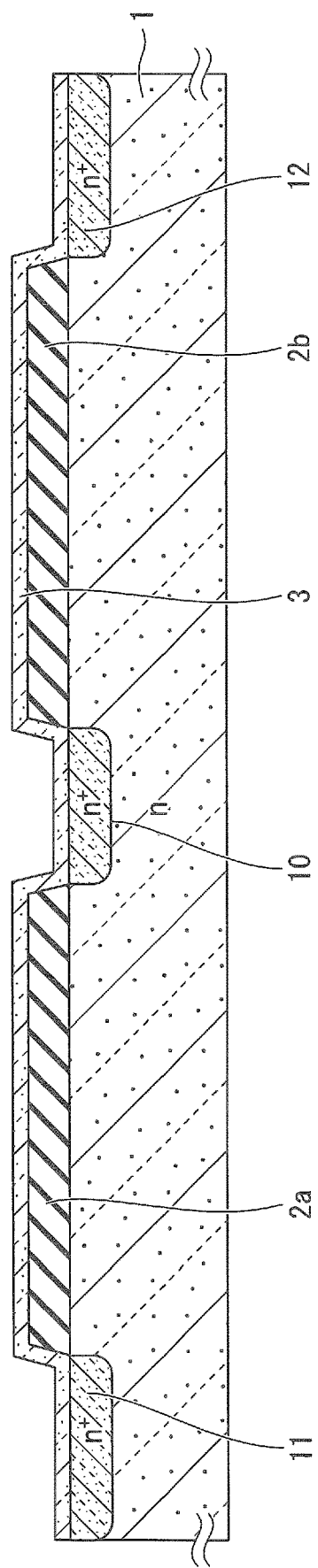
FIG. 9 is a cross-sectional view, continued from FIG. 8, illustrating the process of manufacturing the resistive element according to the first embodiment.
Figure 10:
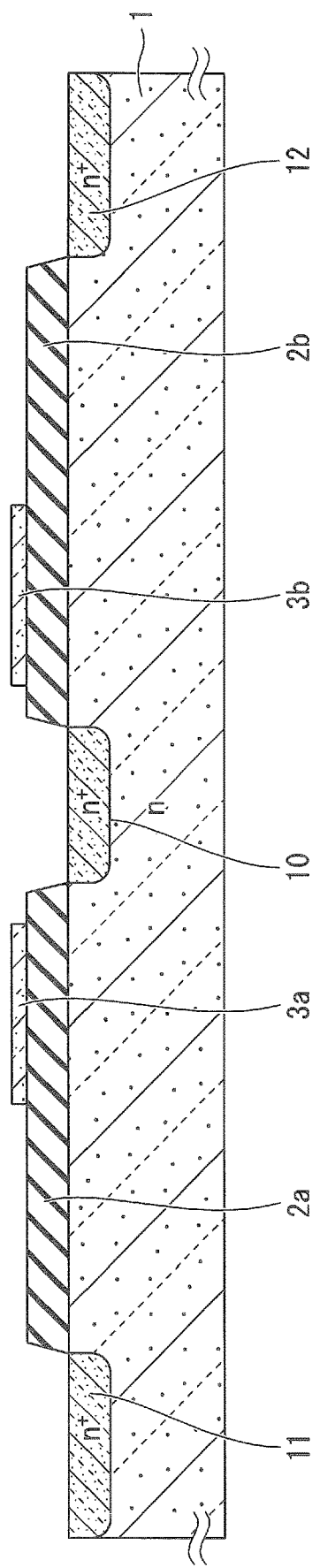
FIG. 10 is a cross-sectional view, continued from FIG. 9, illustrating the process of manufacturing the resistive element according to the first embodiment.

Next, a non-doped polysilicon layer is formed on the semiconductor substrate 1 and the first lower insulating film 2a and the second lower insulating film 2b by a CVD method, for example. N-type impurity ions such as phosphorus (P) are implanted in the polysilicon layer. For example, the phosphorus (P) impurity ions are implanted under the conditions of an acceleration voltage of 80 keV and a dose of about $6.0 \times 10^{15}$ cm$^{-2}$ or less. The impurity ions implanted are activated by annealing, so as to form the DOPOS layer 3 doped with the n-type impurity ions at a high concentration on the entire surface, as illustrated in FIG. 9. A photoresist film is then coated on the top surface of the DOPOS film 3, and is delineated by photolithography. Using the delineated photoresist film as an etching mask, a part of the DOPOS layer 3 is selectively removed by RIE, for example. The photoresist film is then removed, so as to form the first resistive layer 3a and the second resistive layer 3b on the first lower insulating film 2a and the second lower insulating film 2b, as illustrated in FIG. 10.

Figure 11:
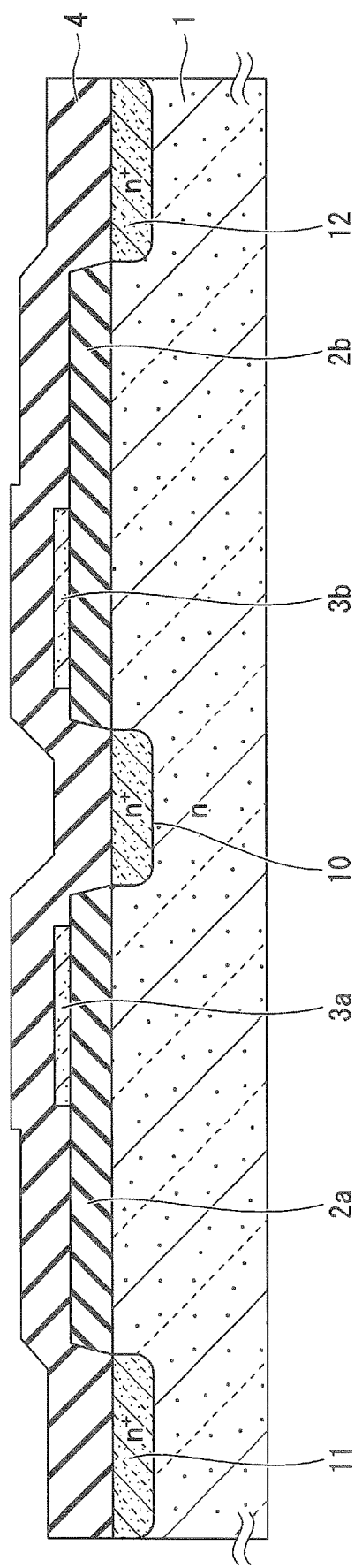
FIG. 11 is a cross-sectional view, continued from FIG. 10, illustrating the process of manufacturing the resistive element according to the first embodiment.
Figure 12:
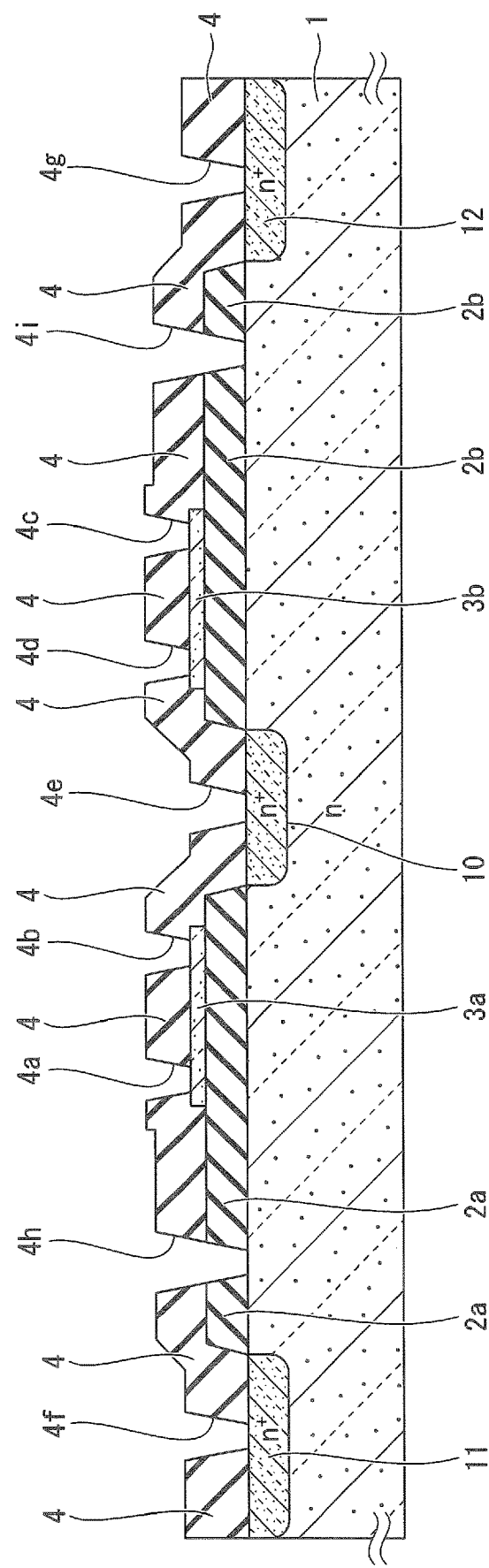
FIG. 12 is a cross-sectional view, continued from FIG. 11, illustrating the process of manufacturing the resistive element according to the first embodiment.

Next, as illustrated in FIG. 11, the interlayer insulating film 4 is deposited to cover the first lower insulating film 2a, the second lower insulating film 2b, the first resistive layer 3a, and the second resistive layer 3b. The interlayer insulating film 4 may be made of a composite film including a NSG film and a PSG film sequentially stacked by a CVD method, for example. A photoresist film is then coated on the interlayer insulating film 4, and is delineated by photolithography. Using the delineated photoresist film as an etching mask, a part of the interlayer insulating film 4 is selectively removed by RIE, for example. The photoresist film is then removed, so as to open a first contact hole 4a, a second contact hole 4b, a third contact hole 4c, a fourth contact hole 4d, a fifth contact hole 4e, a sixth contact hole 4f, and a seventh contact hole 4g in the interlayer insulating film 4, as illustrated in FIG. 12. The interlayer insulating film 4 is simultaneously provided with other contact holes such as an eighth contact hole 4h penetrating the first lower insulating film 2a and the interlayer insulating film 4, and a ninth contact hole 4i penetrating the second lower insulating film 2b and the interlayer insulating film 4.

Figure 13:
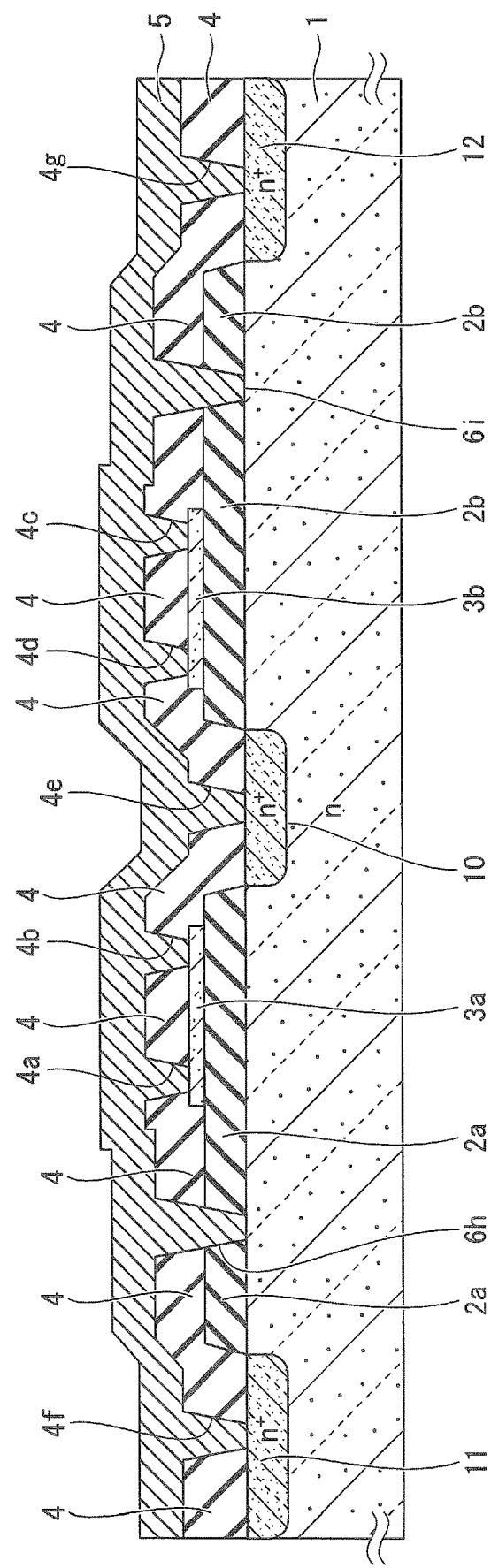
FIG. 13 is a cross-sectional view, continued from FIG. 12, illustrating the process of manufacturing the resistive element according to the first embodiment.
Figure 14:
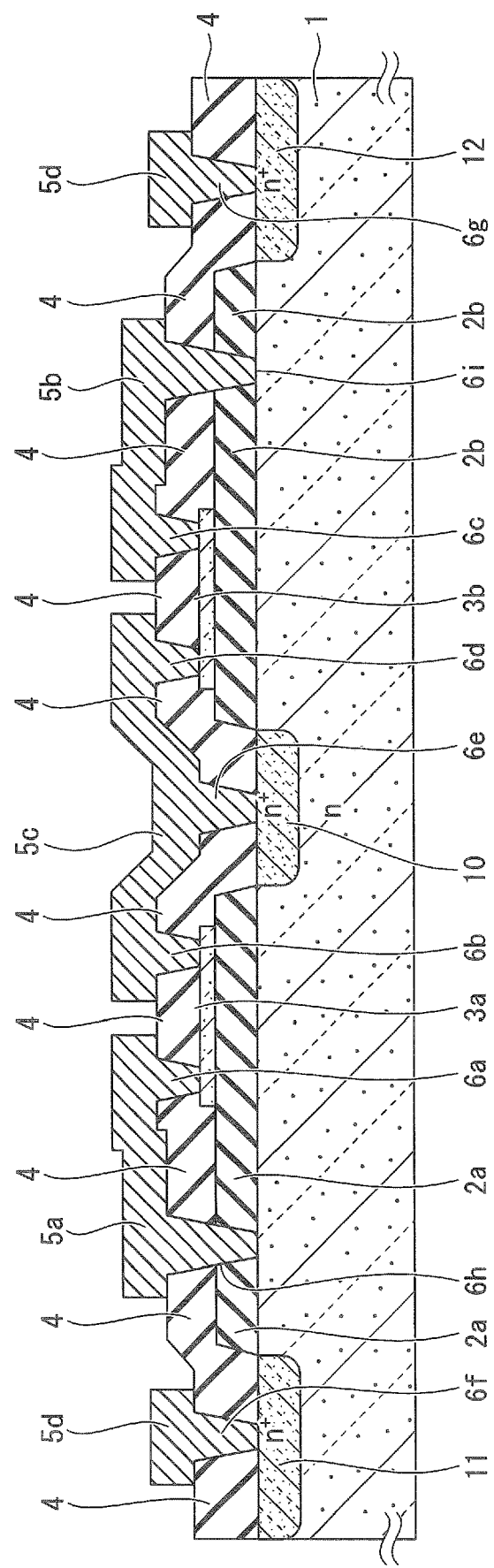
FIG. 14 is a cross-sectional view, continued from FIG. 13, illustrating the process of manufacturing the resistive element according to the first embodiment.

Next, as illustrated in FIG. 13, the metallic film 5 is deposited on the interlayer insulating film 4 to fill the first to ninth contact holes 4a to 4i by vacuum evaporation or sputtering, for example. The metallic film 5 may be made of a Ti/TiN film, an Al—Si film, and a TiN/Ti film sequentially stacked by a CVD method, for example. A photoresist film is then coated on the metallic film 5, and is delineated by photolithography. Using the delineated photoresist film as an etching mask, a part of the metallic film 5 is selectively removed, so as to form the first pad-forming electrode 5a, the second pad-forming electrode 5b, and the relay wire 5c on the interlayer insulating film 4, as illustrated in FIG. 14.

At the same time, the first pad contact region 6a is formed to connect the first pad-forming electrode 5a to the first resistive layer 3a via the first contact hole 4a, and the first relay contact region 6b is formed to connect the first pad-forming electrode 5a to the relay wire 5c via the second contact hole 4b. The substrate contact region 6e is formed to connect the relay wire 5c to the semiconductor substrate 1 via the fifth contact hole 4e. The second pad contact region 6c is formed to connect the second pad-forming electrode 5b to the second resistive layer 3b via the third contact hole 4c, and the second relay contact region 6d is formed to connect the second pad-forming electrode 5b to the relay wire 5c via the forth contact hole 4d. The first edge contact region 6f and the second edge contact region 6g are formed to connect the guard ring layer 5d to the semiconductor substrate 1 via the sixth contact hole 4f and the seventh contact hole 4g. The first parallel contact region 6h and the second parallel contact region 6i are formed to connect the first pad-forming electrode 5a and the second pad-forming electrode 5b to the semiconductor substrate 1 via the eighth contact hole 4h and the ninth contact hole 4i.

Figure 15:
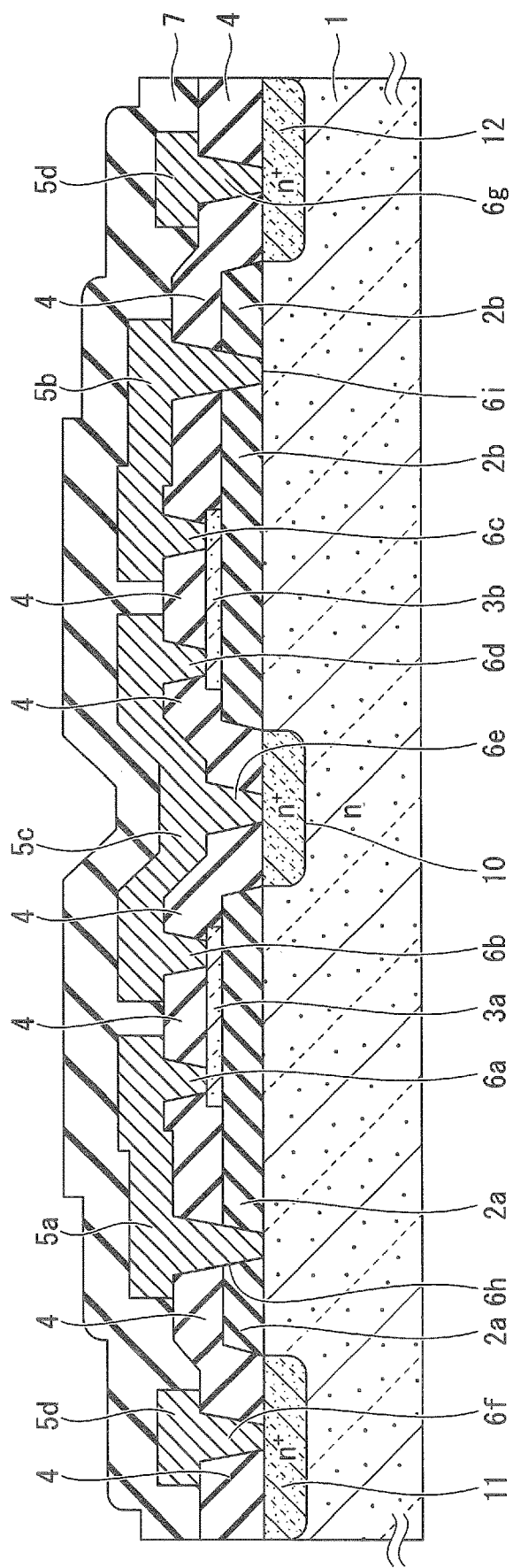
FIG. 15 is a cross-sectional view, continued from FIG. 14, illustrating the process of manufacturing the resistive element according to the first embodiment.
Figure 16:
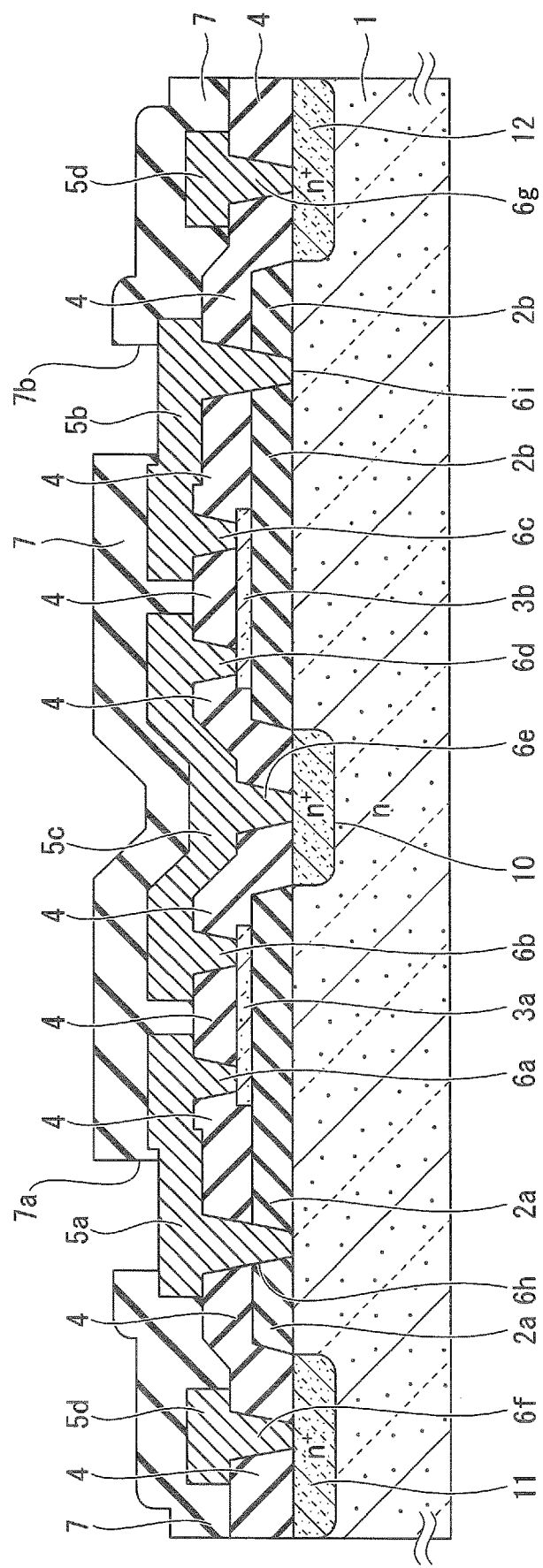
FIG. 16 is a cross-sectional view, continued from FIG. 15, illustrating the process of manufacturing the resistive element according to the first embodiment.

Next, as illustrated in FIG. 15, the passivation film 7 is formed on the first pad-forming electrode 5a, the second pad-forming electrode 5b, the relay wire 5c, and the guard ring layer 5d. For example, the passivation film 7 including a TEOS film, a $Si_3N_4$ film, and a polyimide film is formed such that the TEOS film and the $Si_3N_4$ film are sequentially stacked, and the polyimide film is further coated on the stacked film by a plasma CVD method or the like. A photoresist film is then coated on the passivation film 7, and is delineated by photolithography. Using the delineated photoresist film as an etching mask, a part of the passivation film 7 is selectively removed, so as to provide the first window 7a and the second window 7b in the passivation film 7 as illustrated in FIG. 16. The pair of the first pad-forming electrode 5a and the second pad-forming electrode 5b are thus partly exposed on the first window 7a and the second window 7b so as to define the pad regions for mounting.

Next, the bottom surface of the semiconductor substrate 1 is polished by chemical mechanical polishing (CMP) so as to decrease the thickness of the semiconductor substrate 1 to about 350 micrometers. The counter electrode 9 is then formed on the bottom surface of the semiconductor substrate 1 by vacuum evaporation or sputtering, for example. A plurality of elements, each being equivalent to the resistive element illustrated in FIG. 1 and FIG. 2, are formed in chip regions arranged into a matrix form in a single wafer. The chip regions are diced and divided into chips each corresponding to the resistive element as illustrated in FIG. 1 and FIG. 2.

The method of manufacturing the resistive element according to the first embodiment described above facilitates the fabrication of the resistive element and the semiconductor device using the resistive element capable of decreasing a loss when the main semiconductor element is turned off, while avoiding oscillations of the switching element serving as the main semiconductor element.

First Modified Example

Figure 17:
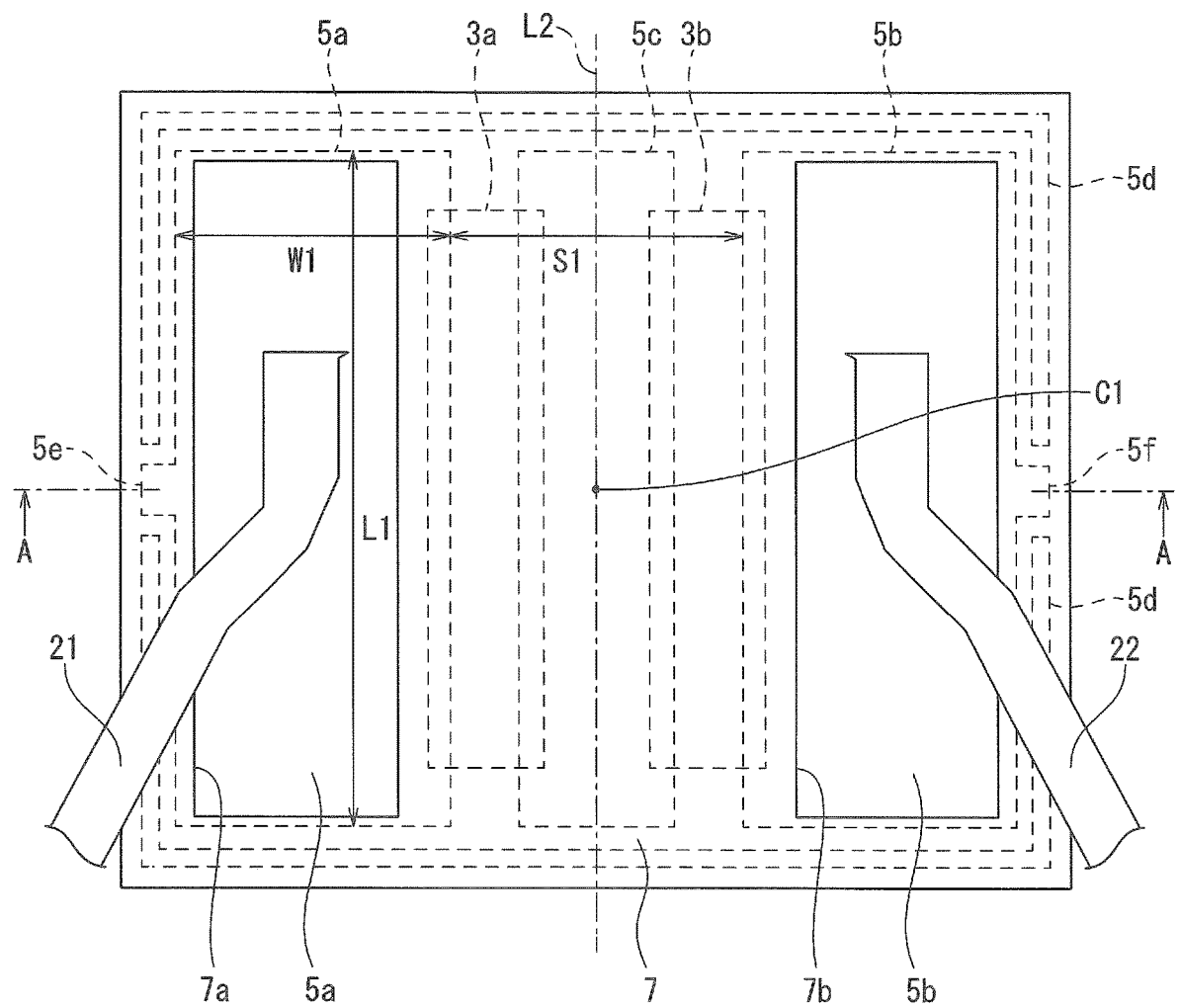
FIG. 17 is a plan view illustrating a resistive element according to a first modified example of the first embodiment.
Figure 18:
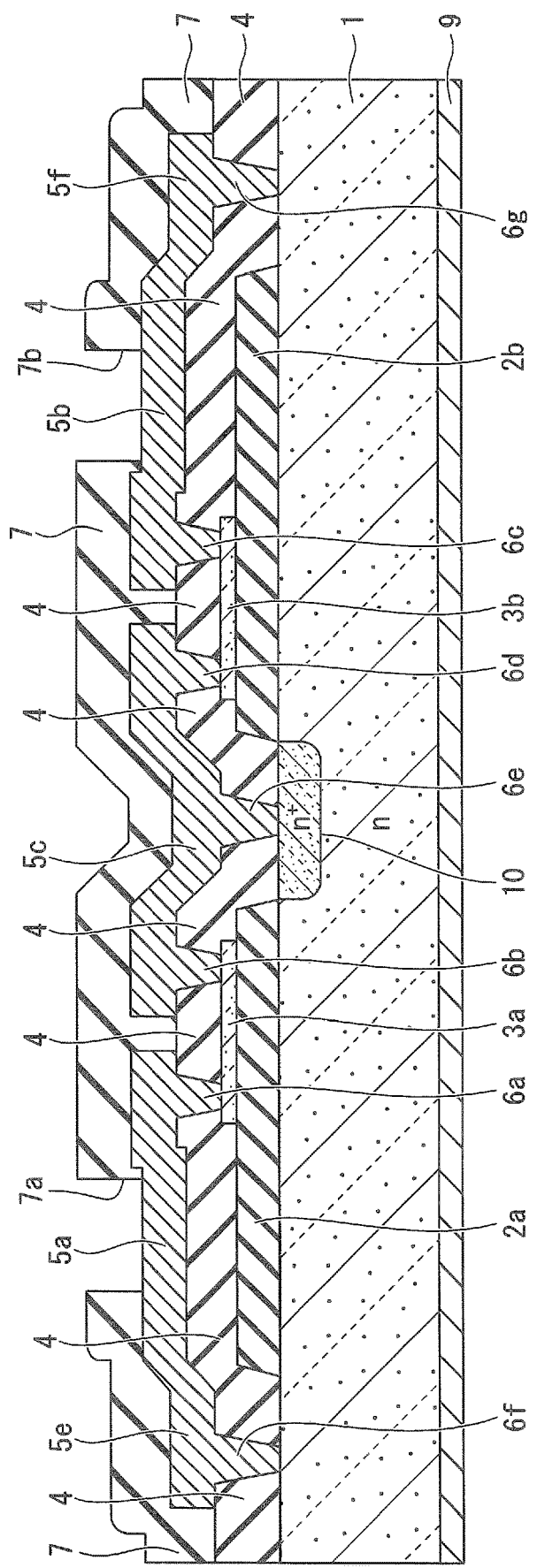
FIG. 18 is a cross-sectional view as viewed from direction A-A in FIG. 17.

A resistive element according to a first modified example of the first embodiment differs from the resistive element according to the first embodiment illustrated in FIG. 1 and FIG. 2 in that the guard ring layer 5d provided along the edge (the chip edge) of the semiconductor chip implementing the resistive element is partly divided, as illustrated in FIG. 17 and FIG. 18. An extending portion (a first extending portion) 5e and another extending portion (a second extending portion) 5f, which are projections of the pair of the first pad-forming electrode 5a and the second pad-forming electrode 5b, are allocated at the divided portions of the guard ring layer 5d. The first extending portion 5e and the second extending portion 5f having a shape determined as appropriate are preferably, but not necessarily, arranged adjacent to the bonded positions of the first bonding wire 21 and the second bonding wire 22.

The first extending portion 5e and the second extending portion 5f are in nonlinear contact (Schottky contact) with the chip edge of the semiconductor substrate 1 via the edge contact region (the first edge contact region) 6f and the other edge contact region (the second edge contact region) 6g penetrating the interlayer insulating film 4. Namely, the Schottky barrier diode is provided between each of the first edge contact region 6f and the second edge contact region 6g and the edge of the semiconductor substrate 1. The other configurations of the resistive element according to the first modified example of the first embodiment are the same as those of the resistive element according to the first embodiment illustrated in FIG. 1 and FIG. 2, and overlapping explanations are not repeated below.

A method of manufacturing the resistive element according to the first modified example may include a step of forming the first extending portion 5e and the second extending portion 5f together with the first pad-forming electrode 5a, the second pad-forming electrode 5b, the relay wire 5c, and the guard ring layer 5d simultaneously in the step as illustrated in FIG. 14. The other steps of the method of manufacturing the resistive element according to the first modified example are the same as those of the manufacturing method for the resistive element according to the first embodiment described above, and overlapping explanations are not repeated below.

Second Modified Example

Figure 19:
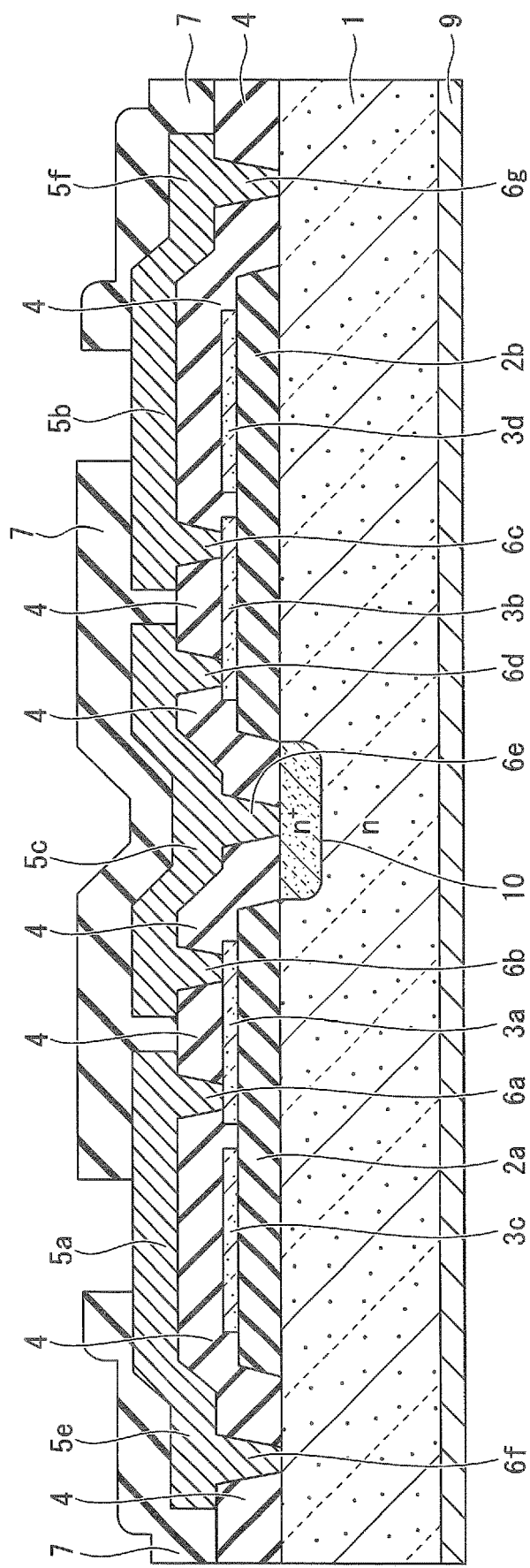
FIG. 19 is a cross-sectional view illustrating a resistive element according to a second modified example of the first embodiment.

A resistive element according to a second modified example of the first embodiment differs from the resistive element according to the first modified example illustrated in FIG. 17 and FIG. 18 in including a first auxiliary film 3c in a floating state in terms of electric potential allocated on the first lower insulating film 2a and separated from the first resistive layer 3a, and in including a second auxiliary film 3d in a floating state in terms of electric potential allocated on the second lower insulating film 2b and separated from the second resistive layer 3b, as illustrated in FIG. 19.

The first auxiliary film 3c is deposited under the first pad-forming electrode 5a and is separated from the first resistive layer 3a. The second auxiliary film 3d is deposited under the second pad-forming electrode 5b and is separated from the second resistive layer 3b. The first auxiliary film 3c and the second auxiliary film 3d include the same material as the first resistive layer 3a and the second resistive layer 3b such as an n-type DOPOS layer, and have the same thickness as the first resistive layer 3a and the second resistive layer 3b. The first auxiliary film 3c and the second auxiliary film 3d have a rectangular planar pattern, for example. The other configurations of the resistive element according to the second modified example are the same as those of the resistive element according to the first modified example illustrated in FIG. 17 and FIG. 18, and overlapping explanations are not repeated below.

The resistive element according to the second modified example including the first auxiliary film 3c and the second auxiliary film 3d in the floating state, can reduce a parasitic capacitance under the pair of the first pad-forming electrode 5a and the second pad-forming electrode 5b, as in the case of increasing the thickness of the first lower insulating film 2a and the second lower insulating film 2b. The resistive element according to the second modified example thus can avoid a decrease in the total resistance upon a reduction in impedance during operation at a high frequency, so as to prevent an oscillation phenomenon.

A method of manufacturing the resistive element according to the second modified example may include a step of forming the first auxiliary film 3c and the second auxiliary film 3d together with the first resistive layer 3a and the second resistive layer 3b by selectively removing the DOPOS layer 3 simultaneously in the step as illustrated in FIG. 10. The other steps of the method of manufacturing the resistive element according to the second modified example are the same as those of the manufacturing method for the resistive element according to the first modified example, and overlapping explanations are not repeated below.

Second Embodiment

Figure 20:
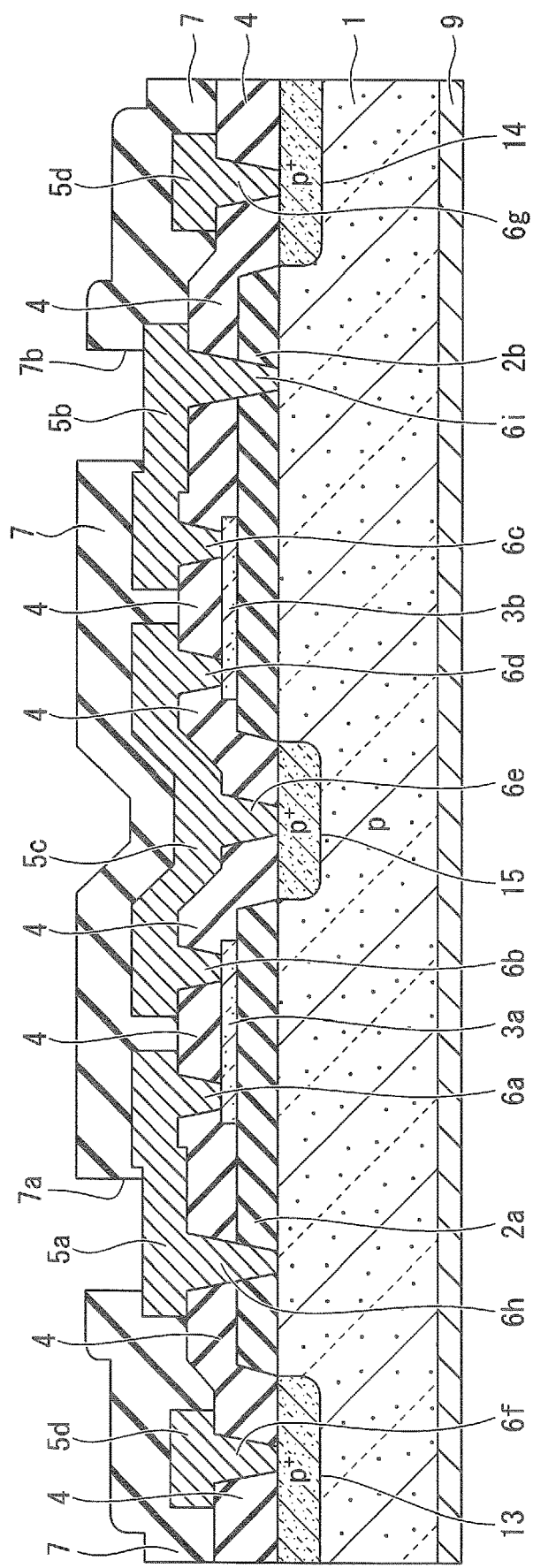
FIG. 20 is a cross-sectional view illustrating a resistive element according to a second embodiment.

A resistive element according to a second embodiment has a configuration common to the resistive element according to the first embodiment illustrated in FIG. 2, including the semiconductor substrate 1, the first lower insulating film 2a and the second lower insulating film 2b deposited on the semiconductor substrate 1, and the first resistive layer 3a and the second resistive layer 3b respectively deposited on the first lower insulating film 2a and the second lower insulating film 2b, as illustrated in FIG. 20. The resistive element according to the second embodiment also has a configuration common to the resistive element according to the first embodiment illustrated in FIG. 2, further including the interlayer insulating film 4 deposited to cover the first lower insulating film 2a, the second lower insulating film 2b, the first resistive layer 3a, and the second resistive layer 3b, and the pair of the first pad-forming electrode 5a and the second pad-forming electrode 5b and the relay wire 5c deposited on the interlayer insulating film 4.

The resistive element according to the second embodiment differs from the resistive element according to the first embodiment illustrated in FIG. 2 in using the semiconductor substrate 1 of a second conductivity-type (p-type), as illustrated in FIG. 20. The content of the resistive component of the semiconductor substrate 1 is preferably decreased to a level which can be ignored with respect to the resistive component of the first resistive layer 3a and the second resistive layer 3b. In particular, the content of the resistive component of the semiconductor substrate 1 is preferably about one hundredth or less of that of the first resistive layer 3a and the second resistive layer 3b. The specific resistivity of the semiconductor substrate 1 may be in a range from about 2 to 60 mΩ·cm. The semiconductor substrate 1 used may be a semiconductor substrate made of material other than silicon. A first peripheral contact region 13, a second peripheral contact region 14, and a middle contact region 15 having the same conductivity type ($p^+$-type) as the semiconductor substrate 1 are provided in the upper portion of the semiconductor substrate 1.

The substrate connection terminal at the middle edge of the T-shaped relay wire 5c is connected to form an ohmic contact to the middle contact region 15 provided in the upper portion of the semiconductor substrate 1 at a low contact resistance via the substrate contact region 6e. The counter electrode (the rear surface electrode) 9 is provided on the rear surface of the semiconductor substrate 1. The first resistive layer 3a and the second resistive layer 3b are thus connected to the semiconductor substrate 1 in series via the relay wire 5c, so as to implement a vertical resistive element including a resistor between the first pad-forming electrode 5a and the counter electrode 9 opposed to each other, and a resistor between the second pad-forming electrode 5b and the counter electrode 9 opposed to each other.

The guard ring layer 5d may be deposited on the interlayer insulating film 4. The guard ring layer 5d includes the same material as the pair of the first pad-forming electrode 5a and the second pad-forming electrode 5b and the relay wire 5c. The guard ring layer 5d is delineated into a ring shape along the outer periphery of the chip of the resistive element according to the second embodiment, for example. The guard ring layer 5d is connected to form an ohmic contact to the first peripheral contact region 13 and the second peripheral contact region 14 provided in the upper portion of the semiconductor substrate 1 via the first edge contact region 6f and the second edge contact region 6g.

In the resistive element according to the second embodiment, the first pad-forming electrode 5a is in nonlinear contact (Schottky contact) with the semiconductor substrate 1 via the contact region (the first parallel contact region) 6h penetrating the first lower insulating film 2a and the interlayer insulating film 4 located immediately under the first pad-forming electrode 5a. Namely, the resistive element according to the second embodiment internally includes the Schottky barrier diode implemented by the first parallel contact region 6h and the semiconductor substrate 1. The second pad-forming electrode 5b is in nonlinear contact (Schottky contact) with the semiconductor substrate 1 via the other contact region (the second parallel contact region) 6i penetrating the second lower insulating film 2b and the interlayer insulating film 4 located immediately under the second pad-forming electrode 5b. Namely, the resistive element according to the second embodiment internally includes the Schottky barrier diode implemented by the second parallel contact region 6i and the semiconductor substrate 1.

In the resistive element according to the second embodiment, in a case of a polarity in which the Schottky barrier diode implemented by the first parallel contact region 6h and the semiconductor substrate 1 and the Schottky barrier diode implemented by the second parallel contact region 6i and the semiconductor substrate 1 conduct a current at a low resistance, the current channels via the first resistive layer 3a and the second resistive layer 3b and the current channels via the Schottky barrier diode implemented by the first parallel contact region 6h and the semiconductor substrate 1 and via the Schottky barrier diode implemented by the second parallel contact region 6i and the semiconductor substrate 1, are formed in parallel. In a case of a polarity in which the Schottky barrier diode implemented by the first parallel contact region 6h and the semiconductor substrate 1 or the Schottky barrier diode implemented by the second parallel contact region 6i and the semiconductor substrate 1 cannot conduct a current at a low resistance, only the current channels via the first resistive layer 3a and the second resistive layer 3b are formed.

Figure 21:
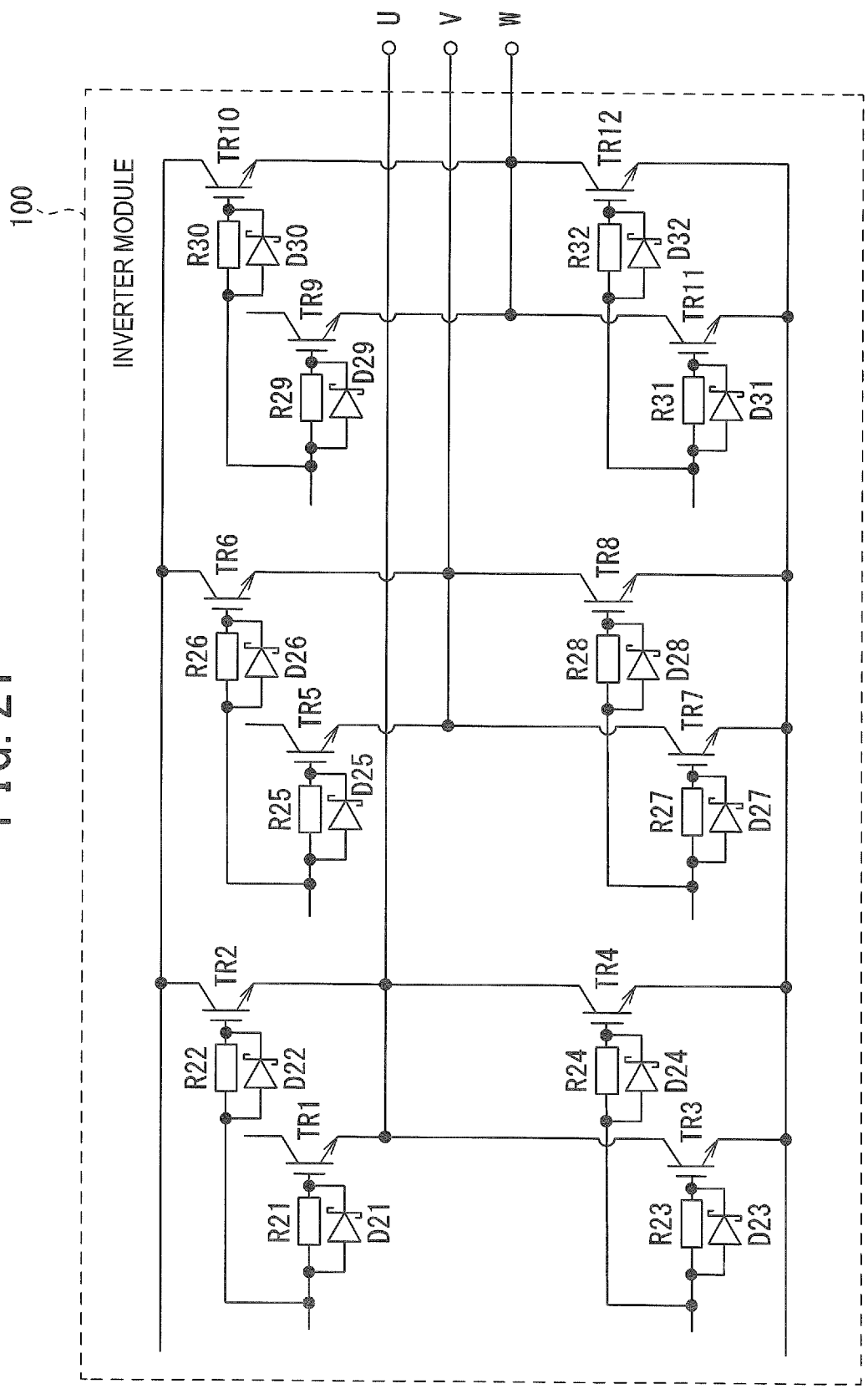
FIG. 21 is a circuit diagram of an inverter using the resistive element according to the second embodiment.

When the resistive element according to the second embodiment is used as a gate resistive element for an IGBT serving as a main semiconductor element, for example, an oscillation phenomenon upon the switching operation of the IGBT can be avoided. The resistive element according to the second embodiment can be used for a gate resistive element of a semiconductor element in an inverter module (a semiconductor device) 100 for driving a three-phase motor having a u-phase, a v-phase, and a w-phase, as illustrated in FIG. 21, for example.

The inverter module 100 includes power main semiconductor elements TR1, TR2, TR3, and TR4 for driving the u-phase, power main semiconductor elements TR5, TR6, TR7, and TR8 for driving the v-phase, and power main semiconductor elements TR9, TR10, TR11, and TR12 for driving the w-phase. The main semiconductor elements TR1 to TR12 are each connected to a freewheeling diode (not illustrated). The main semiconductor elements TR1 to TR12 may each be an IGBT. The gate electrodes of the main semiconductor elements TR1 to TR12 are connected to gate resistive elements R21 to R32. Further, Schottky barrier diodes D21 to D32 are connected in parallel to the gate resistive elements R21 to R32.

The resistive element according to the second embodiment can be used as the pair of the gate resistive elements R21 and R22 and the pair of the Schottky barrier diodes D21 and D22, as the pair of the gate resistive elements R23 and R24 and the pair of the Schottky barrier diodes D23 and D24, as the pair of the gate resistive elements R25 and R26 and the pair of the Schottky barrier diodes D25 and D26, as the pair of the gate resistive elements R27 and R28 and the pair of the Schottky barrier diodes D27 and D28, as the pair of the gate resistive elements R29 and R30 and the pair of the Schottky barrier diodes D29 and D30, and as the pair of the gate resistive elements R31 and R32 and the pair of the Schottky barrier diodes D31 and D32.

For example, the first resistive layer 3a and the second resistive layer 3b illustrated in FIG. 20 correspond to the gate resistive elements R21 and R22. The terminals on the side on which the gate resistive elements R21 and R22 are connected to the gate electrodes of the power main semiconductor elements TR1 and TR2 correspond to the terminals toward the pair of the first pad-forming electrode 5a and the second pad-forming electrode 5b illustrated in FIG. 20. The other terminals on the side opposite to the side on which the gate resistive elements R1 and R2 are connected to the gate electrodes of the power main semiconductor elements TR1 and TR2 correspond to the terminals toward the counter electrode 9 illustrated in FIG. 20. The Schottky barrier diodes D21 and D22 connected in parallel to the gate resistive elements R21 and R22 correspond to the Schottky barrier diode implemented by the first parallel contact region 6h and the semiconductor substrate 1 and the Schottky barrier diode implemented by the second parallel contact region 6i and the semiconductor substrate 1.

When the main semiconductor elements TR1 and TR2 are turned on, the Schottky barrier diodes D21 and D22 are led to the polarity that conducts a current at a low resistance, so that the current flows through the Schottky barrier diodes D21 and D22 and the gate resistive elements R21 and R22 in parallel. When the main semiconductor elements TR1 and TR2 are turned off, the Schottky barrier diodes D21 and D22 are led to the polarity that cannot conduct the current at a low resistance, and the current flows only through the gate resistive elements R21 and R22. This configuration can decrease the gate resistance value when turned on, while keeping the high gate resistance value when turned off, so as to reduce a turn-on loss.

For the group of the pair of the gate resistive elements R21 and R22, the pair of the Schottky barrier diodes D21 and D22, and the main semiconductor elements TR1 and TR2, for example, when the pair of the gate resistive elements R21 and R22 and the pair of the Schottky barrier diodes D21 and D22 are integrated into a single resistor chip (R21, R22, D21, D22), and the main semiconductor elements TR1 and TR2 are integrated into a single IGBT chip (TR1, TR2), the resistor chip (R21, R22, D21, D22) and the IGBT chip (TR1, TR2) are mounted on the substrate.

The resistive element according to the second embodiment thus only requires a single bonding wire for each of the first resistive layer 3a and the second resistive layer 3b, so as to decrease the total number of the bonding wires as compared with a lateral resistive element, as in the case of the resistive element according to the first embodiment. Further, the areas of the pad regions for mounting on the top surface can be decreased as compared with a lateral resistive element, decreasing the size of the chip accordingly.

Further, the Schottky barrier diodes are provided in parallel in the first resistive layer 3a and the second resistive layer 3b, so that the resistance value of the resistive element according to the second embodiment varies depending on the direction of the current flowing through the resistive element according to the second embodiment. The resistive element according to the second embodiment has the polarity of the Schottky barrier diodes opposite to the polarity in the resistive element according to the first embodiment, so as to decrease the gate resistance value when turned on while keeping the high gate resistance value when turned off, reducing a turn-on loss accordingly.

Other Embodiments

While the present invention has been illustrated above by reference to the first and second embodiments, it should be understood that the present invention is not intended to be limited to the descriptions and the drawings composing part of this disclosure. It will be apparent to those skilled in the art that the present invention includes various alternative embodiments, examples, and technical applications according to the technical idea disclosed in the above embodiments.

While FIG. 1, FIG. 2, and FIG. 20 illustrate the resistive elements according to the first and second embodiments with the case of including both the first resistive layer 3a and the second resistive layer 3b in one chip, each chip may be provided with a single resistive layer. For example, the resistive elements according to the first and second embodiments as illustrated in FIG. 1, FIG. 2, and FIG. 20 may eliminate the structure on the right side including the second lower insulating film 2b, the second resistive layer 3b, and the second pad-forming electrode 5b. Alternatively, the resistive elements according to the embodiments may include three or more resistive layers in a single chip. As described above, while the first lower insulating film 2a and the second lower insulating film 2b can be collectively referred to as the "lower insulating film", one of the first lower insulating film 2a and the second lower insulating film 2b may be referred to as the "lower insulating film".

While the present invention has been illustrated with the case of using the resistive element according to the first embodiment as the gate resistive elements R1 to R12 as illustrated in FIG. 3, and using the resistive element according to the second embodiment as the gate resistive elements R21 to R32 as illustrated in FIG. 21, the resistive element according to the present invention is not limited to the gate resistive elements R1 to R12 or R21 to R32, and may be used as a resistive element for various types of ICs.

What is claimed is:
1. A resistive element comprising:
   a semiconductor substrate;

a lower insulating film deposited on the semiconductor substrate;

a resistive layer deposited on the lower insulating film;

an interlayer insulating film covering the resistive layer;

a pad-forming electrode deposited on the interlayer insulating film, and including a first edge portion connected to one edge portion of the resistive layer and a second edge portion opposite to the first edge portion to be in electrical Schottky contact with the semiconductor substrate;

a relay wire having one edge connected to another edge portion of the resistive layer to form an ohmic contact to the semiconductor substrate; and a counter electrode provided under the semiconductor substrate, wherein the resistive element uses a resistance value between the pad-forming electrode and the counter electrode.

2. The resistive element of claim 1, wherein the second edge portion is in Schottky contact with the semiconductor substrate via a substrate contact region penetrating the lower insulating film and the interlayer insulating film.

3. The resistive element of claim 1, wherein:

the pad-forming electrode includes an extending portion extending toward an edge portion of the semiconductor substrate; and the extending portion is in Schottky contact with the semiconductor substrate via an edge contact region penetrating the interlayer insulating film.

4. The resistive element of claim 1, further comprising a middle contact region provided in an upper portion of the semiconductor substrate, having a lower specific resistivity than the semiconductor substrate, and having a conductivity type identical to the semiconductor substrate, wherein the one edge of the relay wire forms an ohmic contact to the middle contact region.

5. The resistive element of claim 1, wherein the semiconductor substrate is a semiconductor substrate of n-type.

6. The resistive element of claim 1, wherein the semiconductor substrate is a semiconductor substrate of p-type.

7. The resistive element of claim 1, further comprising:

another resistive layer deposited under the interlayer insulating film separately from the resistive layer at a different position on the lower insulating film, and electrically connected to another edge opposite to the one edge of the relay wire; and another pad-forming electrode deposited on the interlayer insulating film, and including a third edge portion connected to the other resistive layer and a fourth edge portion opposite to the third edge portion to be in electrical Schottky contact with the semiconductor substrate.

* * * * *